United States Patent
Kimura et al.

(10) Patent No.: US 9,525,516 B2
(45) Date of Patent: Dec. 20, 2016

(54) TRANSMISSION DEVICE AND TRANSMISSION METHOD

(75) Inventors: Ryohei Kimura, Osaka (JP); Toru Oizumi, Osaka (JP); Shinsuke Takaoka, Osaka (JP); Yasuaki Yuda, Kanagawa (JP); Daichi Imamura, Beijing (CN); Fumiyuki Adachi, Miyagi (JP); Tetsuya Yamamoto, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 354 days.

(21) Appl. No.: 14/241,294

(22) PCT Filed: Aug. 16, 2012

(86) PCT No.: PCT/JP2012/005166
§ 371 (c)(1),
(2), (4) Date: Feb. 26, 2014

(87) PCT Pub. No.: WO2013/031118
PCT Pub. Date: Mar. 7, 2013

(65) Prior Publication Data
US 2014/0233482 A1 Aug. 21, 2014

(30) Foreign Application Priority Data
Aug. 30, 2011 (JP) .................. 2011-186909

(51) Int. Cl.
*H04W 4/00* (2009.01)
*H04L 1/00* (2006.01)
(Continued)

(52) U.S. Cl.
CPC ........ *H04L 1/0079* (2013.01); *H03M 13/6525* (2013.01); *H04L 1/0068* (2013.01);
(Continued)

(58) Field of Classification Search
USPC ........................................ 370/329
See application file for complete search history.

(56) References Cited

U.S. PATENT DOCUMENTS

2003/0081576 A1* 5/2003 Kim .................. H04L 1/0003
370/335
2004/0187069 A1* 9/2004 Pietraski .......... H03M 13/2957
714/786
(Continued)

FOREIGN PATENT DOCUMENTS

CN 102035635 A 4/2011
CN 102308507 A 1/2012
(Continued)

OTHER PUBLICATIONS

K. Tahara, K. Higuchi, "Frequency-Domain Punctured Turbo Codes," IEICE Technical Report, RCS2010-33, Jun. 2010, pp. 91-96.
(Continued)

*Primary Examiner* — Gregory Sefcheck
*Assistant Examiner* — Majid Esmaeilian
(74) *Attorney, Agent, or Firm* — Pearne & Gordon LLP

(57) ABSTRACT

A transmission device capable of reducing packet receiving errors and the number of retransmissions by improving error correction coding gain without increasing the amount of resources used in transmission. The transmission device (100) that transmits each bit of coded data constituted from systematic bits and parity bits in order for each transmission unit, and performs frequency puncturing to puncture, in units of symbols, data to be punctured in which each bit has been superimposed on a plurality of frequency domain symbols. A time puncturing unit (102) extracts transmission unit data from the coded data and a frequency puncturing unit (105) performs frequency puncturing in accordance
(Continued)

with the ratio of parity bits to systematic bits included in the data.

15 Claims, 19 Drawing Sheets

(51) Int. Cl.
*H04L 1/18* (2006.01)
*H04W 72/04* (2009.01)
*H04L 27/26* (2006.01)
*H03M 13/29* (2006.01)
*H03M 13/00* (2006.01)

(52) U.S. Cl.
CPC .......... *H04L 1/1819* (2013.01); *H04W 72/04* (2013.01); *H03M 13/2957* (2013.01); *H03M 13/6362* (2013.01); *H04L 27/2636* (2013.01)

(56) References Cited

U.S. PATENT DOCUMENTS

| | | | | |
|---|---|---|---|---|
| 2006/0123277 | A1* | 6/2006 | Hocevar | H03M 13/116 714/704 |
| 2007/0097927 | A1* | 5/2007 | Gorokhov | H04B 1/7103 370/335 |
| 2007/0211667 | A1* | 9/2007 | Agrawal | H04W 72/14 370/335 |
| 2011/0085500 | A1 | 4/2011 | Sangiamwong et al. | |
| 2011/0296283 | A1 | 12/2011 | Li | |
| 2012/0008700 | A1* | 1/2012 | Dateki | H04L 5/0041 375/259 |

FOREIGN PATENT DOCUMENTS

| | | |
|---|---|---|
| JP | 2011-082869 A | 4/2011 |
| WO | 2010/089835 A1 | 8/2010 |

OTHER PUBLICATIONS

Koichi Tahara et. al., "Systematic-Parity Bits Separated Puncturing Method for Frequency-Domain Punctured Turbo Codes", IEICE Technical Report, RCS, Musen Tsushin System 110 (369), Jan. 13, 2011 (Jan. 13, 2011), pp. 179 to 184.

Fujitsu, Adoption of 2-stage Rate Matching and modified IR-HARQ, 3GPP TSG-RAN WG1#50b R1-074184, URL: http://www.3gpp.org/ftp/tsg_ran/WG1_RL1/TSGR1_50b/Docs/R1-074184.zip, Oct. 8, 2007.

* cited by examiner

|  | TIME PUNCTURING | FREQUENCY PUNCTURING |
|---|---|---|
| ERROR CORRECTION CODING GAIN | LOW | HIGH |
| UNITARITY BETWEEN TRANSMITTING DFT AND RECEIVING IDFT | HIGH | LOW |

| NUMBER OF TRANSMISSIONS | $R_f$ |
|---|---|
| FIRST (INITIAL TRANSMISSION) | 1 (FP NOT REQUIRED) |
| SECOND (FIRST RETRANSMISSION) | 4/5 (FP REQUIRED) |
| THIRD (SECOND RETRANSMISSION) | 1/2 (FP REQUIRED) |

FIG. 9

| NUMBER OF TRANSMISSIONS | NUMBER OF BITS TO BE TRANSMITTED | $R_r$ | EFFECTIVE NUMBER OF BITS TO BE TRANSMITTED (AFTER FREQUENCY PUNCTURING) | R (ON THE RECEIVING SIDE) |
|---|---|---|---|---|
| FIRST (INITIAL TRANSMISSION) | 4N/3 | 1 | 4N/3 | 3/4 |
| SECOND (FIRST RETRANSMISSION) | 5N/3 | 4/5 | 4N/3 | 1/3 |
| THIRD (SECOND RETRANSMISSION) | 2N | 1/2 | N | 1/5 |

FIG. 11

| NUMBER OF TRANSMISSIONS | NUMBER OF BITS TO BE TRANSMITTED | $R_s$ ($T_1$=0.5) | $R_f$ | EFFECTIVE NUMBER OF BITS TO BE TRANSMITTED (AFTER FREQUENCY PUNCTURING) | R (ON THE RECEIVING SIDE) |
|---|---|---|---|---|---|
| FIRST (INITIAL TRANSMISSION) | 4N/3 | 0.75 | 1 | 4N/3 | 3/4 |
| SECOND (FIRST RETRANSMISSION) | 5N/3 | 0 | 4/5 | 4N/3 | 1/3 |
| THIRD (SECOND RETRANSMISSION) | 2N | 0 | 1/2 | N | 1/5 |

FIG. 14

| NUMBER OF TRANSMISSIONS | R (ON THE RECEIVING SIDE) | $R_f$ |
|---|---|---|
| FIRST (INITIAL TRANSMISSION) | 1 | 1 |
| SECOND (FIRST RETRANSMISSION) | 1/2 < R < 1 | 2/3 |
| THIRD (SECOND RETRANSMISSION) | 1/3 < R ≤ 1/2 | 4/5 |

TRANSMISSION DEVICE AND TRANSMISSION METHOD

TECHNICAL FIELD

The present invention relates to a transmission apparatus and a transmission method.

BACKGROUND ART

3GPP LTE (3rd Generation Partnership Project Long Term Evolution) employs SC-FDMA (Single Carrier-Frequency Division Multiple Access) as its uplink access scheme. SC-FDMA features a low PAPR (Peak to Average Power Ratio) achieved by the single-carrier scheme of SC-FDMA, flexible data assignment to sub-carrier frequencies, resilience to multipath in frequency-domain signal processing on the receiving side, and the like.

In SC-FDMA, on the transmitting side, SC-FDMA symbols are generated, for example, by converting time-domain symbols into frequency components by a DFT (Discrete Fourier Transform), mapping the frequency components to different sub-carriers, then, converting the mapped frequency components back into a time-domain waveform by an IDFT (Inverse Discrete Fourier Transform), and adding a CP (Cyclic Prefix) to the time-domain signal. Correspondingly, on the receiving side, the time-domain signal is recovered by converting the time-domain signal from the transmitting side into frequency components by a DFT, performing frequency equalization processing on the frequency components, and performing an IDFT on the signal after the frequency equalization processing. As described above, in SC-FDMA, the DFT on the transmitting side (hereinafter referred to as a transmitting DFT) corresponds to the IDFT on the receiving side (hereinafter referred to as a receiving IDFT), and the IDFT on the transmitting side (hereinafter referred to as a transmitting IDFT) corresponds to the DFT on the receiving side (hereinafter referred to as a receiving DFT).

As a new control scheme for the code rate of turbo coding, puncturing in the frequency domain (frequency puncturing, which may hereinafter be abbreviated as FP) has been drawing a lot of attention (see Non-Patent Literature (hereinafter, as abbreviated NPL) 1, for example). The frequency puncturing is a puncturing scheme which is basically used in SC-FDMA systems, and in which puncturing is performed on frequency-domain signals after the transmitting DFT.

A comparison is made below between the frequency puncturing and puncturing in the time domain (time puncturing, which may hereinafter be abbreviated as TP), which is the control scheme for the code rate of turbo coding according to the related art (see FIGS. 1A and 1B).

In the time puncturing, puncturing is performed on encoded bits in the time-domain immediately after turbo coding (i.e., before the transmitting DFT) on a per bit basis. For example, in FIG. 1A, the last two bits are punctured (thinned) among eight encoded bits. In contrast, in the frequency puncturing, puncturing is performed on data to be punctured, in which the encoded bits are convoluted into a plurality of symbols in the frequency domain, on a per symbol basis. For example, in FIG. 1B, the two symbols that are highest in frequency are punctured (thinned) among eight symbols mapped to eight sub-carriers. Thus, in the frequency puncturing, some components of each encoded bit are punctured to a similar extent, while in the time puncturing, the whole of some encoded bits are completely punctured. In other words, contrary to the time puncturing, in the frequency puncturing, the whole of some encoded bits are not completely punctured. In consequence, assuming that transmission power is the same (i.e., the power corresponding to the punctured components is the same), the frequency puncturing allows for more parity bits per transmission than the time puncturing. For example, in the frequency puncturing shown in FIG. 1B, although some components of each encoded bit are punctured, all the eight encoded bits are transmitted, while in the time puncturing shown in FIG. 1A, two bits are completely punctured, and six encoded bits are transmitted. The frequency puncturing may therefore improve an error correction coding gain as compared to the time puncturing by an increase of the number of transmitted parity bits.

In the frequency puncturing, some frequency components of each encoded bit are punctured between the transmitting DFT and the receiving IDFT (i.e., after the transmitting DFT and before the receiving IDFT). This deteriorates unitarity (orthogonality) between the DFT matrix used in the transmitting DFT and the IDFT matrix used in the receiving IDFT, resulting in inter-symbol interference. In contrast, in the time puncturing, some encoded bits are punctured before the transmitting DFT. Thus, the unitarity is retained between the DFT matrix used in the transmitting DFT and the IDFT matrix used in the receiving IDFT.

As described above, in the frequency puncturing and the time puncturing, there is a trade-off between "improving the error correction coding gain by an increase of the number of parity bits" and "retaining the unitarity between the DFT matrix on the transmitting side and the IDFT matrix on the receiving side."

HARQ (Hybrid Automatic Repeat reQuest) is used as an error control technique in packet transmission. HARQ is a technique that combines ARQ (Automatic Repeat reQuest) and error correction coding. 3GPP LTE employs, as HARQ, IR (Incremental Redundancy) using a CB (Circular Buffer). In such IR using a CB, among systematic bits (information data itself) and parity bits (redundant bits) constituting encoded data after turbo coding, the systematic bits are transmitted first, and when an error occurs in the received packets on the receiving side, the parity bits are retransmitted. Since the larger number of parity bits can lead to a higher error correction coding gain, the number of retransmissions can be reduced by an increase in the number of parity bits per transmission (or retransmission).

An example of transmission schemes with HARQ (IR using a CB) used in 3GPP LTE will be described in reference to FIG. 2. Reference characters "S" and "P" shown in FIG. 2 denote systematic bits and parity bits, respectively. In FIG. 2, N systematic bits S and 2N parity bits P are stored in a CB. As shown in FIG. 2, in IR using a CB, the systematic bits (S) are extracted from among encoded bits stored in the CB by performing the time puncturing, and the extracted systematic bits (S) are transmitted in the initial transmission (in the first transmission). As shown in FIG. 2, a portion of the parity bits (P) is extracted from among the encoded bits stored in the CB by performing the time puncturing, and the extracted portion of the parity bits (P) is transmitted in the first retransmission (in the second transmission). In a similar way, a portion of the parity bits (P) is extracted from among the encoded bits stored in the CB by performing the time puncturing, and the extracted portion of the parity bits (P) is transmitted in the second retransmission (in the third transmission).

CITATION LIST

Non-Patent Literature

NPL 1

K. Tahara, K. Higuchi, "Frequency-Domain Punctured Turbo Codes," IEICE Technical Report, RCS2010-33, 2010-6, pp. 91-96

SUMMARY OF INVENTION

Technical Problem

As described above, in 3GPP LTE, only the time puncturing (TP) is performed regardless of the number of transmissions (see FIG. 2). Thus, the number of parity bits is small relative to the number of systematic bits received on the receiving side (the code rate is high) during the early stage of transmission (for example, in the first or second transmission), and therefore, a sufficient error correction coding gain cannot be achieved on the receiving side. As a result, the number of packet reception errors is likely to increase on the receiving side and thus to cause an increase in the number of retransmissions.

In order to address this problem, it is possible to increase the number of parity bits per transmission to improve the error correction coding gain and thus to suppress the increase in the number of retransmissions as described above. However, the increase in the number of parity bits per transmission leads to an increase in the amount of resources used per transmission.

An object of the present invention is to provide a transmission apparatus and a transmission method that can improve the error correction coding gain to reduce the number of packet reception errors and the number of retransmissions without an increase in the amount of resources used for transmission.

Solution to Problem

A transmission apparatus according to an aspect of the present invention is a transmission apparatus that transmits, in sequence on a per transmission basis, bits of encoded data including a systematic bit and a parity bit, and that performs frequency puncturing to puncture, on a per symbol basis, puncturing target data in which the bits are convoluted into a plurality of symbols in a frequency domain, the apparatus including: an extraction section that extracts the data on a per transmission basis from the encoded data; and a puncturing section that performs the frequency puncturing based on a ratio between a systematic bit and a parity bit included in the data.

A transmission method according to an aspect of the present invention is a transmission method of transmitting, in sequence on a per transmission basis, bits of encoded data including a systematic bit and a parity bit, and performing frequency puncturing to puncture, on a per symbol basis, puncturing target data in which the bits are convoluted into a plurality of symbols in a frequency domain, the transmission method including: extracting data on a per transmission basis from the encoded data; and performing the frequency puncturing based on a ratio between a systematic bit and a parity bit included in the data.

Advantageous Effects of Invention

According to the present invention, it is possible to reduce the number of packet reception errors by improving the error correction coding gain without an increase in the amount of resources used for transmission and thus to reduce the number of retransmissions.

BRIEF DESCRIPTION OF DRAWINGS

FIG. 9 shows a relationship between the number of transmissions and the frequency puncturing rate according to Embodiment 1 of the present invention (transmission example 1);

FIG. 11 shows a relationship between the number of transmissions and the frequency puncturing rate according to Embodiment 1 of the present invention (transmission example 2);

FIG. 14 shows a relationship between the ratio of the number of systematic bits to the total number of bits to be transmitted and the frequency puncturing rate according to Embodiment 2 of the present invention;

DESCRIPTION OF EMBODIMENTS

Figure 1:
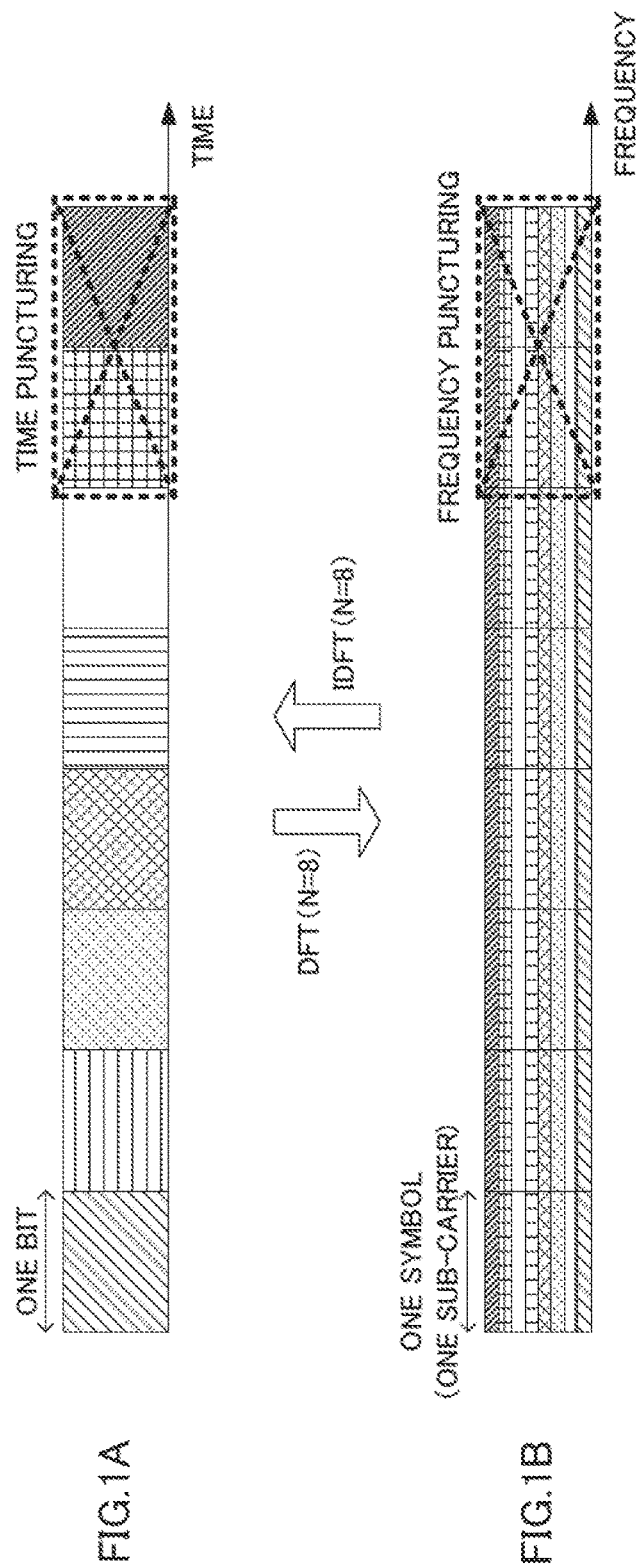
FIGS. 1A and 1B illustrate the time puncturing and the frequency puncturing, respectively.
Figure 2:
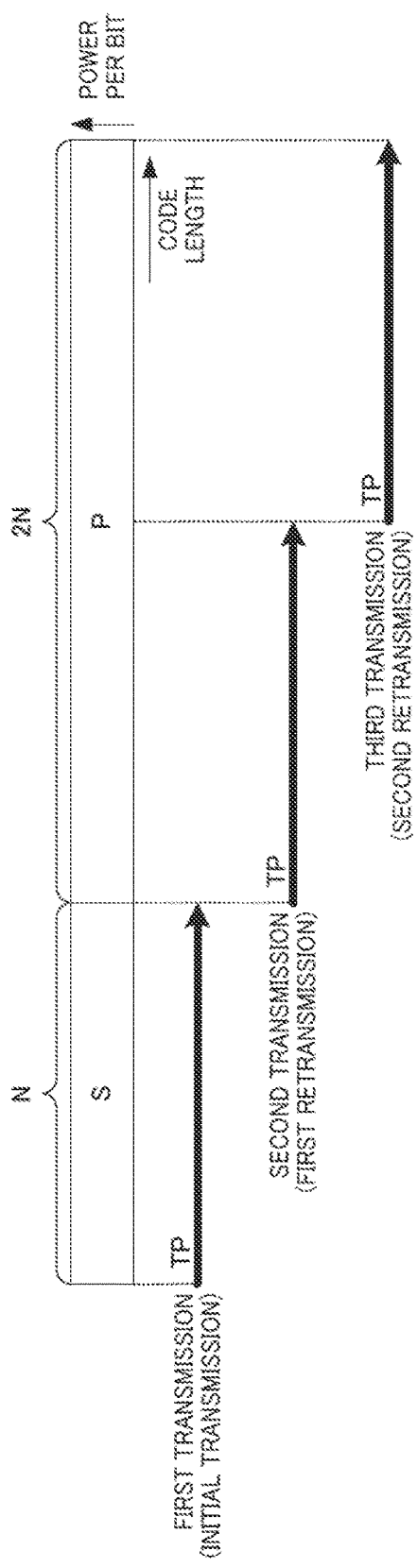
FIG. 2 illustrates a process of IR using a CB.

Embodiments of the present invention will be described in detail below with reference to the accompanying drawings. In the embodiments, the same components are denoted by the same reference characters, and the description of those components is not repeated for conciseness.

Embodiment 1

Figure 3:
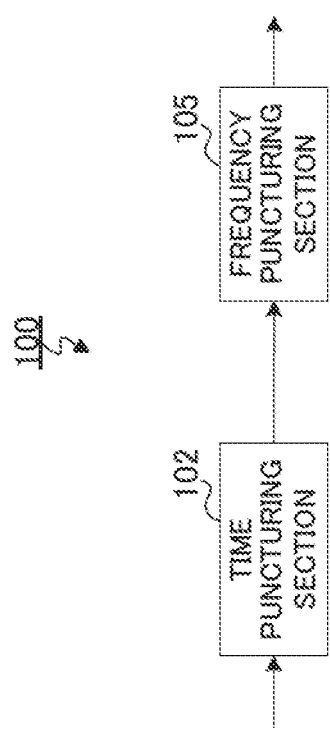
FIG. 3 is a block diagram that illustrates major components of a transmission apparatus according to Embodiment 1 of the present invention.

FIG. 3 illustrates major components of transmission apparatus 100 according to the present embodiment. Transmission apparatus 100 shown in FIG. 3 transmits bits of encoded data in sequence on a per transmission basis, the encoded data including systematic bits and parity bits, and performs the frequency puncturing to puncture data to be punctured, in which data the bits are convoluted into a plurality of symbols in the frequency domain, on a per symbol basis. In transmission apparatus 100, time puncturing section 102 extracts data on a per transmission basis from the encoded data, and frequency puncturing section 105 performs the frequency puncturing depending on a ratio between the systematic bits and the parity bits included in the data.

Figure 4:
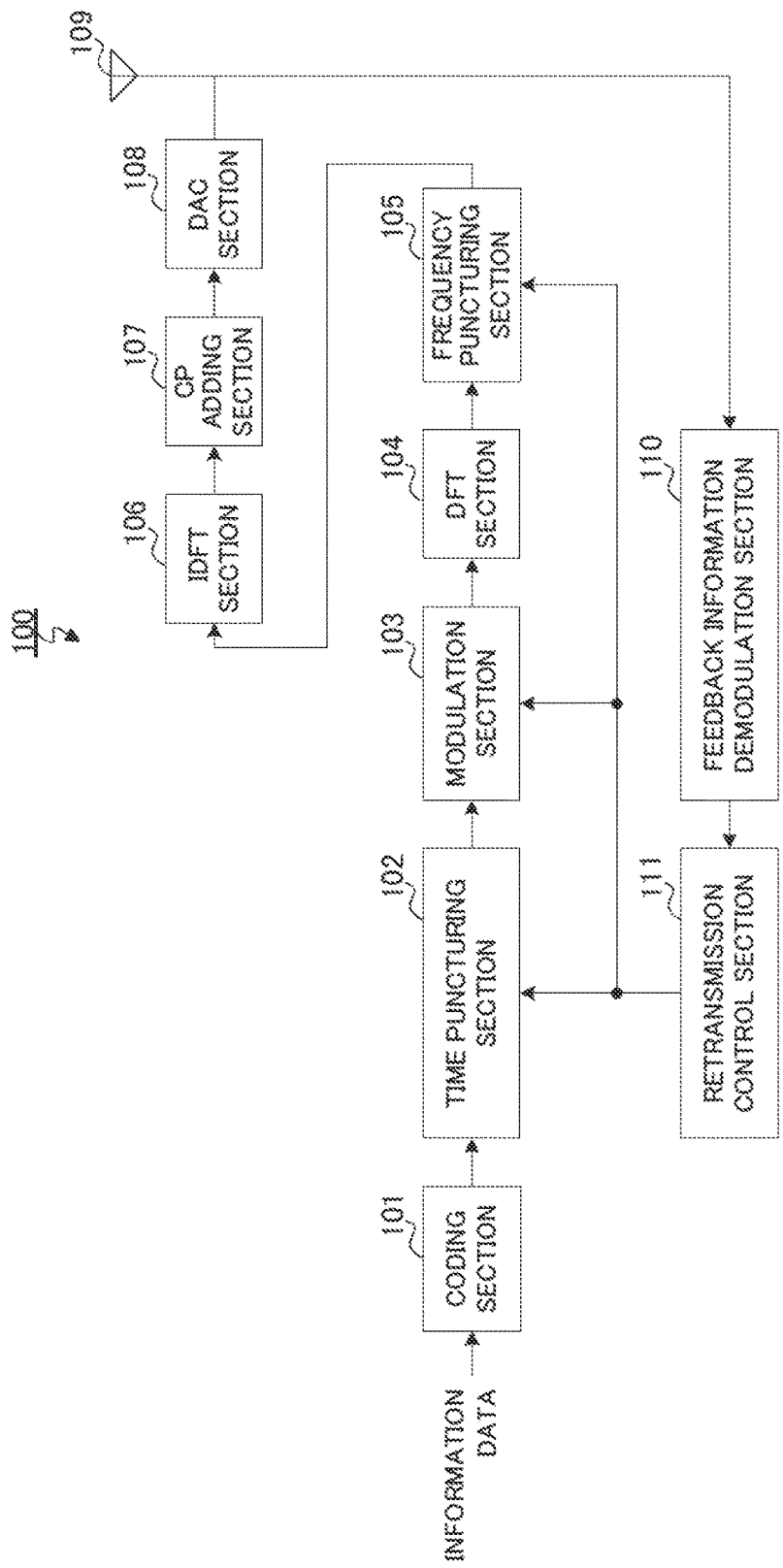
FIG. 4 is a block diagram that illustrates a configuration of the transmission apparatus according to Embodiment 1 of the present invention.

FIG. 4 is a block diagram that illustrates a configuration of the transmission apparatus according to the present embodiment. Transmission apparatus 100 shown in FIG. 4 transmits bits of encoded data, which include systematic bits and parity bits, to a reception apparatus in sequence on a per transmission basis.

Coding section 101 performs coding (for example, turbo coding) on information data to generate encoded bits including systematic bits (information data itself) and parity bits (redundant data). Coding section 101 outputs the generated encoded bits to time puncturing section 102.

Time puncturing section 102 has a CB (Circular Buffer) and stores the encoded bits input from coding section 101. Time puncturing information is also input from retransmission control section 111, which will be described below, to time puncturing section 102. The time puncturing information indicates whether a retransmission is performed or not, the starting position of bits to be transmitted, and the number of bits to be transmitted. If a retransmission is not performed (which means the current transmission is the initial transmission), time puncturing section 102 extracts, from among the encoded bits stored in the CB, encoded bits (initial-transmission data), the number of which is equal to the number of bits to be transmitted indicated in the time puncturing information. It should be noted that the initial-transmission data includes at least the systematic bits. Otherwise, if a retransmission is performed, time puncturing section 102 extracts, from among the encoded bits stored in the CB, the parity bits (retransmission data) for the number of transmission bits indicated in the time puncturing information. In this way, time puncturing section 102 generates the initial-transmission data or the retransmission data by extracting data on a per transmission basis from among the encoded bits stored in the CB. In other words, the time puncturing (puncturing on a per bit basis) is equivalent to extracting bit on a per transmission basis. Time puncturing section 102 outputs the extracted encoded bits (the initial-transmission data or the retransmission data) to modulation section 103.

Modulation section 103 generates modulated symbols by digitally modulating the encoded bits (the initial-transmission data or the retransmission data) input from time puncturing section 102 according to a modulation level input from retransmission control section 111. Modulation section 103 outputs the generated modulated symbols to DFT section 104.

DFT section 104 performs DFT processing (the transmitting DFT) on the modulated symbols input from modulation section 103 to convert the time-domain signal into frequency-domain signals (symbols). DFT section 104 outputs the modulated symbols after the DFT to frequency puncturing section 105.

Frequency puncturing information is input from retransmission control section 111 to frequency puncturing section 105. Frequency puncturing information includes a frequency puncturing rate and positions of sub-carriers to be frequency-punctured, or a frequency puncturing matrix that includes the frequency puncturing rate and the positions of sub-carriers (the positions of symbols) to be frequency-punctured. Frequency puncturing section 105 performs the frequency puncturing on the modulated symbols in the frequency domain input from DFT section 104 according to the frequency puncturing information and outputs the modulated symbols after the frequency puncturing to IDFT section 106.

The frequency puncturing rate represents a ratio of the number of symbols after the frequency puncturing (i.e., the number of symbols output from frequency puncturing section 105) to the number of symbols before the frequency puncturing (i.e., the number of symbols input to frequency puncturing section 105) and is expressed by the following expression 1:

(Expression 1)

$$R_f = \frac{\text{Number of Symbols } \textit{Output from} \text{ Frequency Puncturing Section}}{\text{Number of Symbols Input } \textit{to Frequency} \text{ Puncturing Section}} \quad [1]$$

According to expression 1, if the frequency puncturing rate $R_f=1$, the frequency puncturing is not performed, and if the frequency puncturing rate $R_f<1$, the frequency puncturing is performed. In addition, the smaller the frequency puncturing rate $R_f$ is, the smaller the number of output symbols becomes (the larger the number of punctured symbols becomes).

The frequency puncturing matrix is a matrix in which the number of columns corresponds to the number of modulated symbols in the frequency domain (the number of sub-carriers to which the modulated symbols are mapped), and all the elements in the columns corresponding to symbols (sub-carriers) to be punctured are set to zero (i.e., zero columns). The sub-carrier components corresponding to the zero columns are set to zero (punctured) by multiplying the modulated symbols in the frequency domain by the frequency puncturing matrix.

IDFT section 106 performs IDFT processing (the transmitting IDFT) on the modulated symbols (in the frequency domain) input from frequency puncturing section 105 to convert the frequency-domain signals into a time-domain signal. At this point, IDFT section 106 assigns zero to the frequency-punctured frequency resources (sub-carriers) (zero padding) to perform the IDFT. IDFT section 106 outputs the signal (in the time domain) after the IDFT to CP (Cyclic Prefix) adding section 107.

Pilot signals (reference signals, not shown) and the modulated symbols (i.e., the data signals) from IDFT section 106 are input to CP adding section 107. CP adding section 107 prepends as a CP to a multiplexed signal, which is generated by multiplexing the pilot signals and the modulated symbols, a signal that is identical to the end portion of the multiplexed signal, thereby generating an SC-FDMA signal.

DAC section 108 performs transmission processing such as D/A conversion on the SC-FDMA signal (digital signal) input from CP adding section 107 and transmits the signal after the transmission processing (analog signal) from antenna 109.

Feedback information demodulation section 110 receives feedback information transmitted from reception apparatus 200, which will be described below (FIG. 5), via antenna 109, and demodulates the received feedback information. Feedback information includes retransmission information indicating whether a retransmission is performed or not (i.e., presence or absence of a retransmission request (for example, ACK/NACK information indicating ACK or NACK)), the number of bits to be transmitted, and an MCS (Modulation and Coding Scheme). Feedback information demodulation section 110 outputs the retransmission information to retransmission control section 111.

Using at least the retransmission information input from feedback information demodulation section 110, retransmission control section 111 generates the time puncturing information (whether a retransmission is performed or not, the starting position of bits to be transmitted, and the number of bits to be transmitted), the frequency puncturing information (whether a retransmission is performed or not, a frequency puncturing matrix (or a frequency puncturing rate and positions of sub-carriers)), and the information on the modulation level, as described above. Then, retransmission control section 111 outputs the time puncturing information to time puncturing section 102, the modulation level to modulation section 103, and the frequency puncturing information to frequency puncturing section 105.

Figure 5:
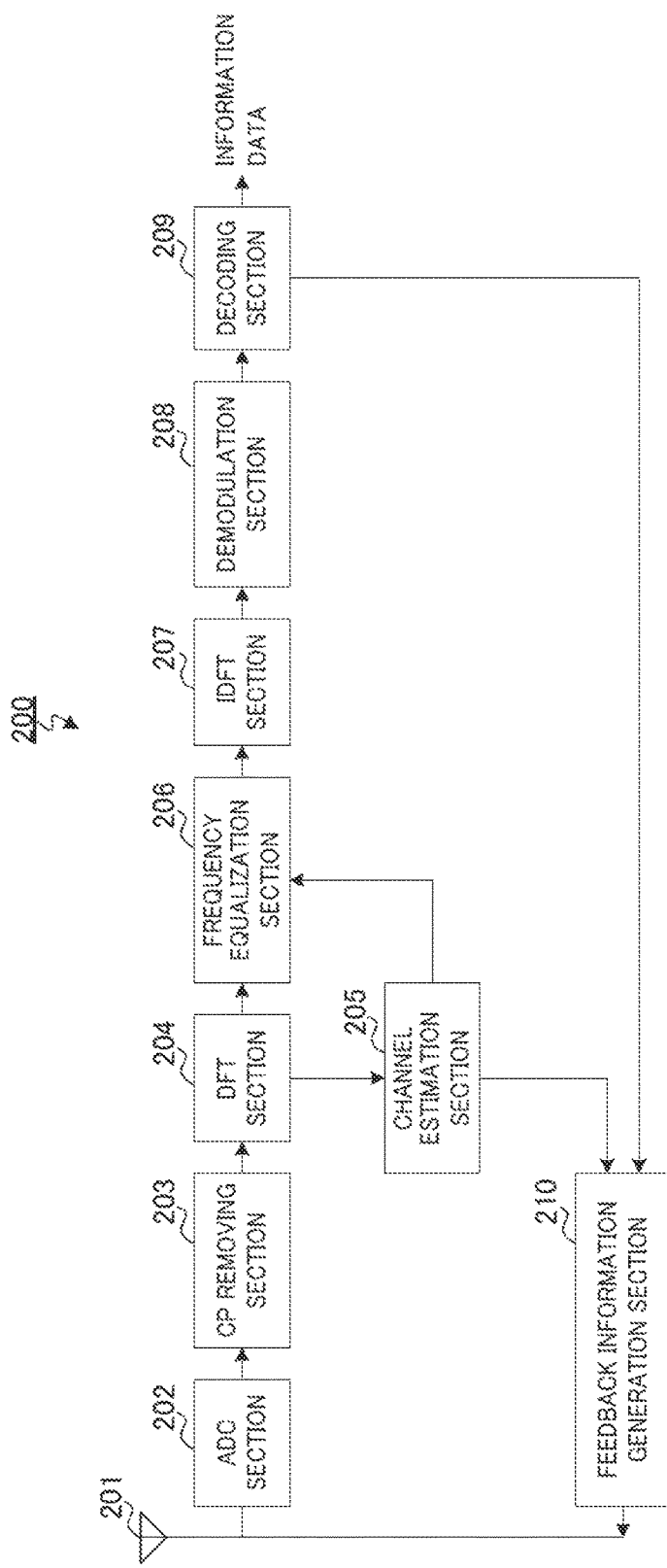
FIG. 5 is a block diagram that illustrates a configuration of a reception apparatus according to Embodiment 1 of the present invention.

FIG. 5 is a block diagram that illustrates a configuration of the reception apparatus according to the present embodiment.

In reception apparatus 200 shown in FIG. 5, ADC section 202 receives an SC-FDMA signal (analog signal) from transmission apparatus 100 (FIG. 4) via antenna 201, performs reception processing such as A/D conversion on the received analog signal and outputs the signal after the reception processing (digital signal) to CP removing section 203.

CP removing section 203 removes the CP from the received signal after the reception processing.

DFT section 204 performs DFT processing (the receiving DFT) on the received signal (in the time domain) input from CP removing section 203 to convert the time-domain signals to frequency-domain signals. Then, DFT section 204 outputs the signals after the DFT, i.e., the frequency-domain signals to channel estimation section 205 and frequency equalization section 206.

Channel estimation section 205 performs channel estimation by means of pilot signals (reference signals) included in the frequency-domain signals input from DFT section 204. Then, channel estimation section 205 outputs channel estimation values indicating estimation results to frequency equalization section 206 and feedback information generation section 210.

Frequency equalization section 206 performs frequency equalization on data signals included in the frequency-domain signals input from DFT section 204 by using the channel estimation values input from channel estimation section 205. For example, frequency equalization section 206 uses the channel estimation values to generate frequency equalization weighting for frequency equalization processing, and multiplies sub-carriers to which the data signals (symbols) are assigned by the frequency equalization weighting, thereby removing the effect of interference (for example, multipath fading). Frequency equalization section 206 outputs the data signals after the frequency equalization to IDFT section 207.

IDFT section 207 performs IDFT processing (the receiving IDFT) on the data signals (modulated symbols in the frequency domain) input from frequency equalization section 206 to convert the frequency-domain signals to a time-domain signal. IDFT section 207 then outputs the time-domain signal to demodulation section 208.

Demodulation section 208 performs demodulation processing (for example, soft decision processing in the IQ plane) on the signal input from IDFT section 207, and outputs the signal after the demodulation (for example, soft decision bits) to decoding section 209.

Decoding section 209 decodes (for example, turbo-decodes) the signal input from demodulation section 208 and outputs the signal after the decoding as received data (information data). Also, decoding section 209 outputs a result of decoding (whether the decoding succeeded or not) to feedback information generation section 210.

Feedback information generation section 210 determines an MCS and the number of bits to be transmitted for data to be transmitted from transmission apparatus 100 based on the channel estimation values input from channel estimation section 205. Feedback information generation section 210 also generates information on whether a retransmission is performed or not (i.e., ACK/NACK information) based on the results of decoding input from decoding section 209. Finally, feedback information generation section 210 generates feedback information that includes retransmission information indicating whether a retransmission is performed or not, the number of bits to be transmitted, and the MCS, and transmits the feedback information to transmission apparatus 100 via antenna 201.

Operation of transmission apparatus 100 (FIG. 4) will be described, hereinafter.

Figures 6, 7:
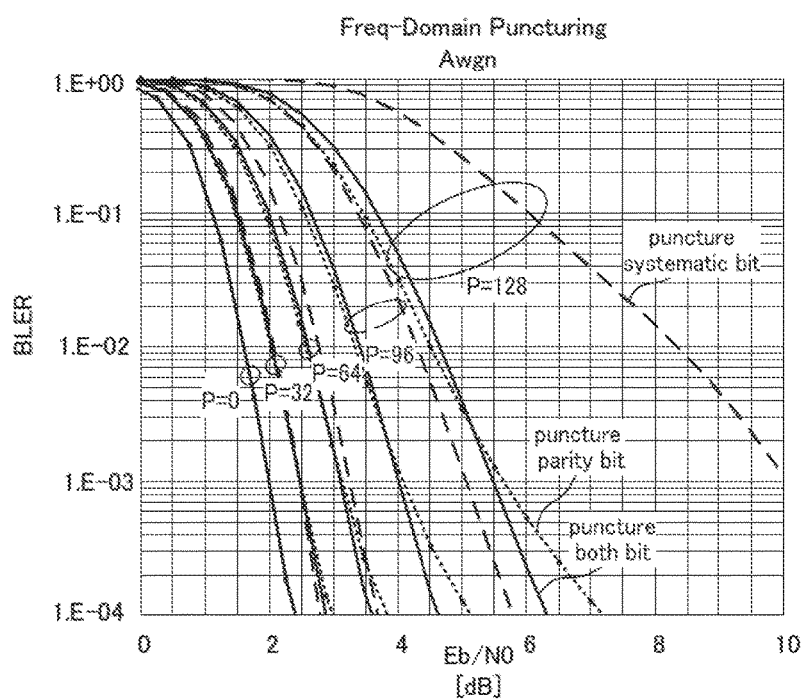
FIG. 6 shows the characteristics of the time puncturing and the frequency puncturing according to Embodiment 1 of the present invention.
FIG. 7 illustrates error rate performances when the frequency puncturing is applied to different kinds of bits according to Embodiment 1 of the present invention.

FIG. 6 shows the characteristics of the time puncturing and the frequency puncturing. Assuming that transmission power is the same, as described above, the frequency puncturing enables transmission of a larger number of bits to be transmitted than the time puncturing. In other words, the frequency puncturing can virtually provide a lower code rate than the time puncturing. In consequence, as shown in FIG. 6, the frequency puncturing allows for a higher error correction coding gain than the time puncturing.

As described above, the frequency puncturing (frequency puncturing section 105) is executed as processing between the transmitting DFT (DFT section 104) and the receiving IDFT (IDFT section 207). Thus, the frequency puncturing deteriorates the unitarity between the transmitting DFT and the receiving IDFT. In contrast, the time puncturing (time puncturing section 102) is executed as processing before the transmitting DFT (DFT section 104). The time puncturing can, therefore, retain the unitarity between the transmitting DFT and the receiving IDFT. In consequence, as shown in FIG. 6, the time puncturing is better than the frequency puncturing in that the unitarity is retained between the transmitting DFT and the receiving IDFT.

Consequently, as shown in FIG. 6, there is a trade-off between the "error correction coding gain" and the "unitarity between the transmitting DFT and the receiving IDFT." Due to this trade-off, when the time puncturing and the frequency puncturing are combined, degrees of deterioration of the "unitarity between the transmitting DFT and the receiving IDFT" and improvement of the "error correction coding gain" change depending on degrees of the effects of respective puncturing on data to be transmitted (for example, respective puncturing rates). In other words, combining the time puncturing and the frequency puncturing with transmission power kept constant can improve the "error correction coding gain" while suppressing deterioration of the "unitarity between the transmitting DFT and the receiving IDFT." For example, NPL 1 discloses the fact that the combination of time puncturing and frequency puncturing can provide a better FER (Frame Error Rate) than the time puncturing alone and the frequency puncturing alone.

How the packet error rate is affected by what is frequency-punctured (systematic bits or parity bits) will be described, hereinafter.

FIG. 7 illustrates the results of computer simulation conducted by the inventors, which show error rate performances (BLER (Block Error Rate)) in the cases where the frequency puncturing was applied: (1) only to the parity bits (represented by dotted lines); (2) to both the systematic bits and the parity bits (represented by solid lines); and (3) only to the systematic bits (represented by broken lines). FIG. 7 illustrates the error rate performances (BLER) in the cases (1)-(3), where the total number of symbols was 256, and components corresponding to P=0, 32, 64, 96, 128 symbols were frequency-punctured.

As can be seen in FIG. 7, for example, in particular, at the error rate performances of $10^{-2}$ (1E-02), the error rate performances in the case where the frequency puncturing was applied only to the parity bits (represented by the dotted lines) are the best, the error rate performances in the case where the frequency puncturing was applied to both the systematic bits and the parity bits (represented by the solid lines) are the second best, and the error rate performances in the case where the frequency puncturing was applied only to the systematic bits (represented by the broken lines) are the worst. This is because the systematic bits (information bits themselves) are more important than the parity bits (redundant bits) in the decoding processing (for example, turbo decoding) on the receiving side, and thus puncturing the systematic bits results in much more deterioration of receiving performance (decoding performance). It is therefore preferable to avoid the frequency puncturing on the systematic bits in order to suppress the deterioration of receiving performance on the receiving side caused by the frequency puncturing.

That is, the packet error rate can be efficiently improved by applying the frequency puncturing only to the parity bits instead of combining the time puncturing and the frequency puncturing without any condition.

In consideration of the above, in the present embodiment, transmission apparatus 100 extracts data on a per transmission basis from encoded data (time puncturing), and then performs the frequency puncturing based on a ratio between the systematic bits and the parity bits included in the data. For example, the initial transmission includes the systematic bits, and retransmission data includes only the parity bits. Transmission apparatus 100, therefore, does not perform the frequency puncturing in the initial transmission, and performs the frequency puncturing in retransmissions. In other words, transmission apparatus 100 determines whether or not the frequency puncturing is applied to data on a per transmission basis, based on the number of transmissions.

It should be noted that in HARQ based on IR using a CB, systematic bits and parity bits are transmitted in sequence. Transmission apparatus 100 can therefore determine whether the frequency puncturing is applied or not easily based on the kinds of bits to be transmitted (systematic bit or parity bit).

Transmission examples 1 and 2 according to the present embodiment will be described, hereinafter.

Transmission Example 1

Figure 8:
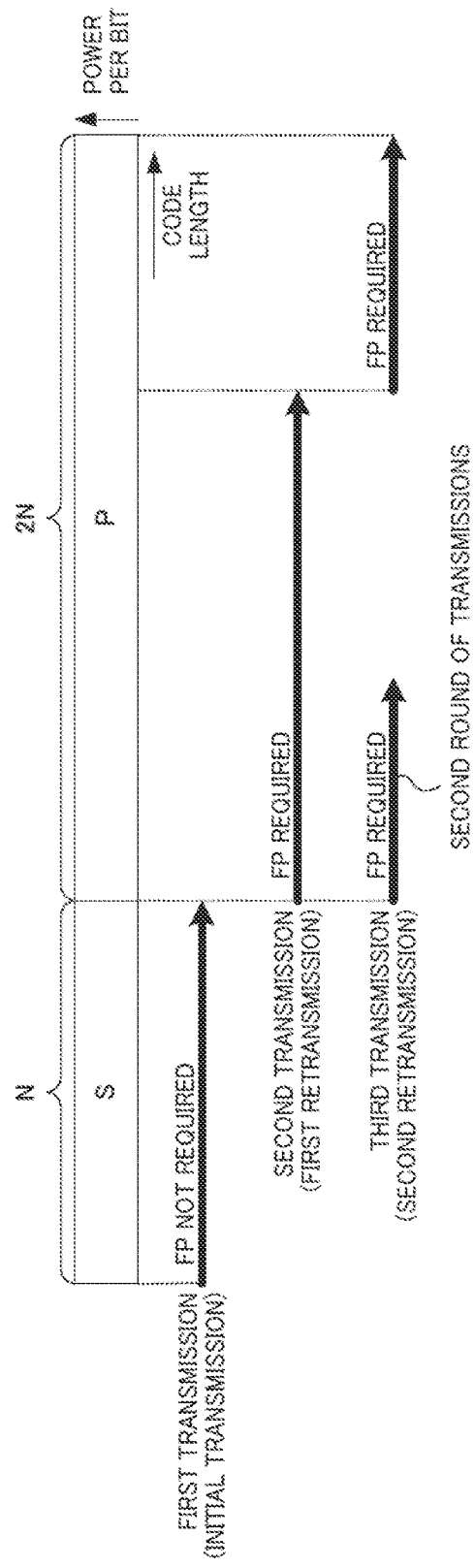
FIG. 8 illustrates an example of the transmission process according to Embodiment 1 of the present invention (transmission example 1)

FIG. 8 illustrates an example of the transmission process in transmission apparatus 100 in transmission example 1. As shown in FIG. 8, the number of systematic bits S is N, and the number of parity bits P is 2N (and thus coding section 101 has a code rate of ⅓).

Retransmission control section 111 of transmission apparatus 100 provides time puncturing information (positions of bits to be transmitted and the number of bits to be transmitted) to time puncturing section 102 every time a transmission occurs. Based on the time puncturing information, for example, as shown in FIG. 8, time puncturing section 102 extracts the systematic bits S by the time puncturing in the first transmission (in the initial transmission), and extracts a portion of the parity bits P by the time puncturing in the second transmission (in the first retransmission) or in the third transmission (in the second retransmission).

Retransmission control section 111 also indicates to frequency puncturing section 105 whether or not the frequency puncturing is applied to data to be transmitted based on the number of transmissions of the data to be transmitted. For example, retransmission control section 111 instructs frequency puncturing section 105 not to apply the frequency puncturing (FP not required) in the first transmission (in the initial transmission) and instructs frequency puncturing section 105 to apply the frequency puncturing (FP required) in the second or later transmission (in a retransmission). Thus, for example, frequency puncturing section 105 does not apply the frequency puncturing (FP not required) in the first transmission (in the initial transmission) and does apply the frequency puncturing (FP required) in the second or third transmission (in the first or second retransmission).

In consequence, frequency puncturing section 105 performs the frequency puncturing on retransmission data that includes only the parity bits and does not perform the frequency puncturing on initial-transmission data that includes only the systematic bits. In other words, frequency puncturing section 105 does not perform the frequency puncturing in the initial transmission and performs the frequency puncturing in retransmissions. This enables reception apparatus 200 to receive all the components of the systematic bits, thereby retaining the decoding performance. Moreover, as shown in FIG. 7, for example, the error rate performances can be improved by applying the frequency puncturing to retransmission data that includes only the parity bits.

Alternatively, as shown in FIG. 9, for example, retransmission control section 111 may indicate the frequency puncturing rate $R_f=1$ (FP not required) in the first transmission (in the initial transmission), indicate the frequency puncturing rate $R_f=⅘$ (FP required) in the second transmission (in the first retransmission), and indicate the frequency puncturing rate $R_f=½$ (FP required) in the third transmission (in the second retransmission). Accordingly, frequency puncturing section 105 performs the frequency puncturing with the frequency puncturing rate $R_f$ changed for data to be transmitted based on the number of transmissions.

The frequency puncturing performed by frequency puncturing section 105 will be described in detail, hereinafter.

Frequency puncturing section 105 performs the frequency puncturing on modulated symbols input from DFT section 104 with the use of a frequency puncturing matrix that includes a frequency puncturing rate and positions of symbols (positions of sub-carriers) to be punctured (thinned) by the frequency puncturing, for example.

A "DFT output sequence," which consists of modulated symbols (in the frequency domain) input from DFT section 104, is expressed by the following expression 2:

(Expression 2)

$$DFTOutputSequence = \\ DX = \begin{bmatrix} 1 & 1 & 1 & 1 & 1 & 1 \\ 1 & W^{1\cdot1} & W^{1\cdot2} & W^{1\cdot3} & W^{1\cdot4} & W^{1\cdot5} \\ 1 & W^{2\cdot1} & W^{2\cdot2} & W^{2\cdot3} & W^{2\cdot4} & W^{2\cdot5} \\ 1 & W^{3\cdot1} & W^{3\cdot2} & W^{3\cdot3} & W^{3\cdot4} & W^{3\cdot5} \\ 1 & W^{4\cdot1} & W^{4\cdot2} & W^{4\cdot3} & W^{4\cdot4} & W^{4\cdot5} \\ 1 & W^{5\cdot1} & W^{5\cdot2} & W^{5\cdot3} & W^{5\cdot4} & W^{5\cdot5} \end{bmatrix} \begin{bmatrix} x_1 \\ x_2 \\ x_3 \\ x_4 \\ x_5 \\ x_6 \end{bmatrix},$$

$$W = e^{\frac{-j2\pi}{6}}$$

In expression 2, D denotes a DFT matrix used by DFT section 104 (the transmitting DFT) and X denotes a modulated symbol matrix (modulated symbols $x_1$-$x_6$) input to DFT section 104. In addition, assume that the DFT size=6.

A frequency puncturing matrix P is expressed, for example, by the following expression 3:

(Expression 3)

$$\text{Frequency Puncturing Matrix } P = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \end{bmatrix}$$

The number of columns of the frequency puncturing matrix P corresponds to the DFT size=6 (i.e., the number of sub-carriers to which the modulated symbols are mapped) (in expression 3, the number of columns is six), and all the elements in the columns corresponding to symbols (sub-carriers) to be punctured are set to zero (zero columns). For example, let sub-carriers #1-#6 be sub-carriers to which the modulated symbols are mapped, the frequency components of sub-carriers #5 and #6, which correspond to zero columns (the fifth column and the sixth column), are to be punctured according to expression 3. Thus, the frequency puncturing matrix P indicates a frequency puncturing rate ($R_f$=⅔, according to expression 3) and positions of sub-carriers to be frequency-punctured (sub-carriers #5 and #6, according to expression 3).

Frequency puncturing section 105 can generate a frequency-punctured signal (an output sequence of frequency puncturing section 105, see expression 4) by multiplying the modulated symbol sequence DX expressed by expression 2 by the frequency puncturing matrix P expressed by expression 3. In doing so, according to expression 2 and expression 3, the components of sub-carriers #5 and #6, into which the modulated symbols $x_1$-$x_6$ are convoluted, are punctured.

(Expression 4)

Frequency Puncturing Section *OutputSequence*

$$= \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \end{bmatrix} \begin{bmatrix} 1 & 1 & 1 & 1 & 1 & 1 \\ 1 & W^{1\cdot1} & W^{1\cdot2} & W^{1\cdot3} & W^{1\cdot4} & W^{1\cdot5} \\ 1 & W^{2\cdot1} & W^{2\cdot2} & W^{2\cdot3} & W^{2\cdot4} & W^{2\cdot5} \\ 1 & W^{3\cdot1} & W^{3\cdot2} & W^{3\cdot3} & W^{3\cdot4} & W^{3\cdot5} \\ 1 & W^{4\cdot1} & W^{4\cdot2} & W^{4\cdot3} & W^{4\cdot4} & W^{4\cdot5} \\ 1 & W^{5\cdot1} & W^{5\cdot2} & W^{5\cdot3} & W^{5\cdot4} & W^{5\cdot5} \end{bmatrix} \begin{bmatrix} x_1 \\ x_2 \\ x_3 \\ x_4 \\ x_5 \\ x_6 \end{bmatrix}$$

$$= \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \end{bmatrix}$$

$$\begin{bmatrix} x_1 + x_2 + x_3 + x_4 + x_5 + x_6 \\ x_1 + W^{1\cdot1}x_2 + W^{1\cdot2}x_3 + W^{1\cdot3}x_4 + W^{1\cdot4}x_5 + W^{1\cdot5}x_6 \\ x_1 + W^{2\cdot1}x_2 + W^{2\cdot2}x_3 + W^{2\cdot3}x_4 + W^{2\cdot4}x_5 + W^{2\cdot5}x_6 \\ x_1 + W^{3\cdot1}x_2 + W^{3\cdot2}x_3 + W^{3\cdot3}x_4 + W^{3\cdot4}x_5 + W^{3\cdot5}x_6 \\ x_1 + W^{4\cdot1}x_2 + W^{4\cdot2}x_3 + W^{4\cdot3}x_4 + W^{4\cdot4}x_5 + W^{4\cdot5}x_6 \\ x_1 + W^{5\cdot1}x_2 + W^{5\cdot2}x_3 + W^{5\cdot3}x_4 + W^{5\cdot4}x_5 + W^{5\cdot5}x_6 \end{bmatrix}$$

Transmission Example 2

In contrast to transmission example 1 (FIG. 8) where only the systematic bits are transmitted in the initial transmission, in transmission example 2, both the systematic bits and the parity bits are transmitted in the initial transmission.

Figure 10:
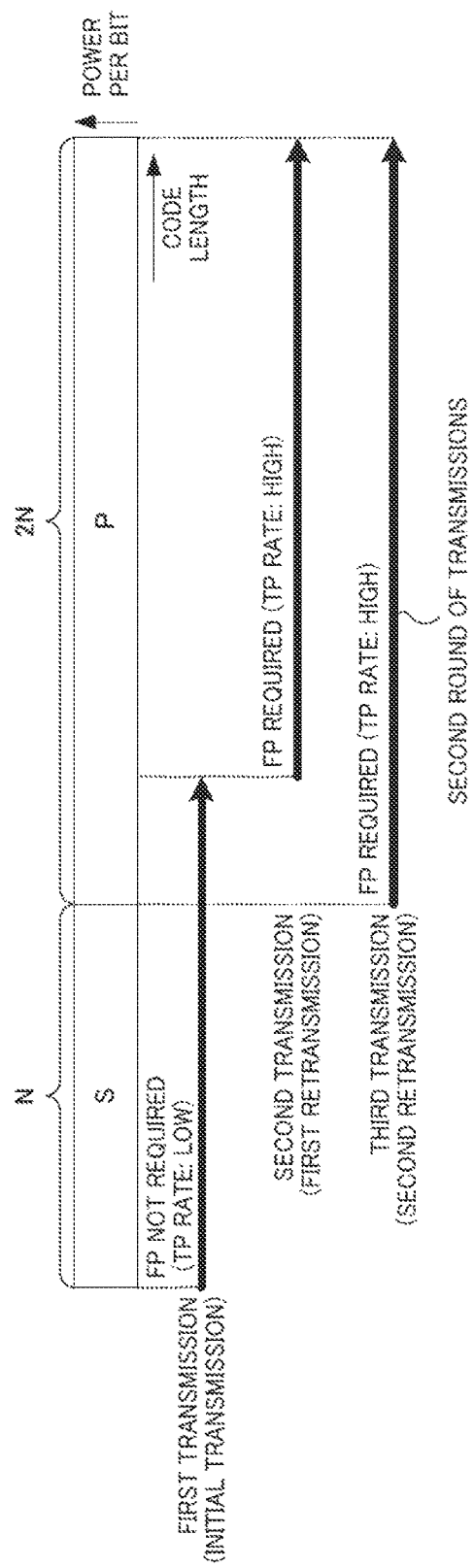
FIG. 10 illustrates an example of the transmission process according to Embodiment 1 of the present invention (transmission example 2)

FIG. 10 illustrates an example of the transmission process in transmission apparatus 100 in transmission example 2. As shown in FIG. 10, the number of systematic bits S is N, and the number of parity bits P is 2N (and thus coding section 101 has a code rate of ⅓). The term "TP rate" stands for a time puncturing rate and is represented, for example, by $R_t$ in the following expression 5:

(Expression 5)

$$R_t = \frac{\text{Number of Bits } Output from \text{ Time Puncturing Section}}{\text{Number of Bits Input } to Time \text{ Puncturing Section}}$$

FIG. 11 shows the number of bits to be transmitted (the number of bits that are actually transmitted, i.e., the number of bits that are extracted from a CB by the time puncturing), the frequency puncturing rate $R_f$, the effective number of bits to be transmitted after the frequency puncturing, and the code rate R on the receiving side for each number of transmissions in transmission example 2.

The effective number of bits to be transmitted is a value obtained by converting the number of bits to be transmitted on which the frequency puncturing has been performed into the assumed number of bits to be transmitted on which the time puncturing equivalent to the frequency puncturing has been performed. The effective number of bits to be transmitted is calculated by multiplying the number of bits to be transmitted by the frequency puncturing rate $R_f$ as expressed by the expression 6 below. For example, let the number of bits to be transmitted be 2N [bits] and the frequency puncturing rate $R_f$ be ½, the effective number of bits to be transmitted is N. This means that although 2N [bits] are actually transmitted when 2N [bits] to be transmitted are frequency-punctured, the transmission power after the frequency puncturing is equivalent to the transmission power for N bits obtained by performing the time puncturing instead of the frequency puncturing.

(Expression 6)

Effective Number of Bits to Be Transmitted=Number of Bits to Be Transmitted×$R_f$ [6]

The code rate R represents a ratio of the number of systematic bits to the total number of received bits (i.e., the sum of the number of bits that are currently received and the number of bits that are stored in a receiving buffer (memory)) of transmitted data (initial-transmission data and retransmission data) received by reception apparatus 200 in relation to certain information data, as expressed by the following expression 7.

(Expression 7)

$$R = \frac{\text{Number of Systematic Bits}}{\text{Total Number of Received Bits}} \quad [7]$$

Retransmission control section 111 of transmission apparatus 100 presents time puncturing information (positions of bits to be transmitted and the number of bits to be transmitted) to time puncturing section 102 every time a transmission occurs. Based on the time puncturing information, for example, as shown in FIG. 10, time puncturing section 102 extracts the systematic bits S (N bits, according to FIG. 11) and a portion of the parity bits P (N/3 bits, according to FIG. 11) by the time puncturing in the first transmission (in the initial transmission). In addition, time puncturing section 102 extracts a portion of the parity bits P (5N/3 bits, according to FIG. 11) by the time puncturing in the second transmission (in the first retransmission) and extracts all the parity bits P (2N bits, according to FIG. 11) by the time puncturing in the third transmission (in the second retransmission).

As in transmission example 1, retransmission control section 111 also indicates to frequency puncturing section 105 whether or not the frequency puncturing is applied to data to be transmitted based on the number of transmissions of the data to be transmitted. Thus, for example, frequency puncturing section 105 does not apply the frequency puncturing (FP not required, $R_f=1$) in the first transmission (in the initial transmission), does apply the frequency puncturing (FP required, $R_f=4/5$) in the second transmission (in the first retransmission), and does apply the frequency puncturing (FP required, $R_f=1/2$) in the third transmission (in the second retransmission).

In other words, as in transmission example 1, frequency puncturing section 105 does not perform the frequency puncturing in the initial transmission and does perform the frequency puncturing in retransmissions. In particular, frequency puncturing section 105 performs the frequency puncturing on retransmission data that includes only the parity bits, and does not perform the frequency puncturing on initial-transmission data that includes the systematic bits. In addition, frequency puncturing section 105 performs the frequency puncturing with the frequency puncturing rate $R_f$ changed based on the number of transmissions.

Retransmission control section 111 may also control the time puncturing rate (TP rate) $R_t$ depending on whether the frequency puncturing can be applied or not so that transmission power (or the overall puncturing rate ($R_o/R_t/R_f$; $R_o$ represents a primitive code rate (a code rate of coding section 101))) is generally kept the same for different transmissions no matter whether the frequency puncturing is applied or not. For example, as shown in FIG. 10, since the frequency puncturing is not performed on initial-transmission data, retransmission control section 111 may reduce the time puncture rate $R_t$, accordingly. On the contrary, as shown in FIG. 10, since the frequency puncturing is performed on retransmission data, retransmission control section 111 may increase the time puncture rate $R_t$, accordingly.

Transmission examples 1 and 2 of the present embodiment have been described above.

As described above, transmission apparatus 100 (frequency puncturing section 105) performs the frequency puncturing on retransmission data including parity bits (in the second or later transmission), and does not perform the frequency puncturing on initial-transmission data including systematic bits, as shown in FIG. 8 and FIG. 10. That is, transmission apparatus 100 determines whether the frequency puncturing can be applied or not based on the number of transmissions (the kind of data to be transmitted in each transmission).

As a result, the systematic bits are decoded (turbo-decoded) in reception apparatus 200 by using all the components. This can prevent deterioration of decoding performance (error rate performances) on the receiving side. Moreover, for the parity bits, the combination of time puncturing and frequency puncturing realizes a low code rate virtually with the use of the frequency puncturing. The error correction coding gain can therefore be improved by increasing the number of parity bits superficially without an increase in transmission power (i.e., the amount of resources) per transmission with the use of the frequency puncturing as compared to error correction coding gains obtained by using only the time puncturing.

In consequence, according to the present embodiment, the error correction coding gain can be improved by applying the combination of time puncturing and frequency puncturing to the parity bits, while deterioration of the error rate performances for the systematic bits is prevented by applying the frequency puncturing only to the parity bits. As described above, according to the present invention, the number of packet reception errors and the number of retransmissions can be reduced by improving the error correction coding gain without any increase in the amount of resources used for transmission.

Furthermore, according to the present embodiment, the frequency puncturing rate $R_f$ is changed based on the number of transmissions. For example, according to FIG. 11, the frequency puncturing rate $R_f=1/2$ for the second retransmission is smaller than the frequency puncturing rate $R_f=4/5$ for the first retransmission. This means that more components are thinned by the frequency puncturing in the second retransmission than in the first retransmission. However, since the larger the number of retransmissions is, the lower the code rate R on the receiving side becomes (due to an increase in the number of parity bits), the error correction coding gain can be improved. That is, the amount of resources used for transmission can be reduced, while an error correction coding gain is achieved on the receiving side by setting the frequency puncturing rate lower for the larger number of retransmissions.

Figure 12:
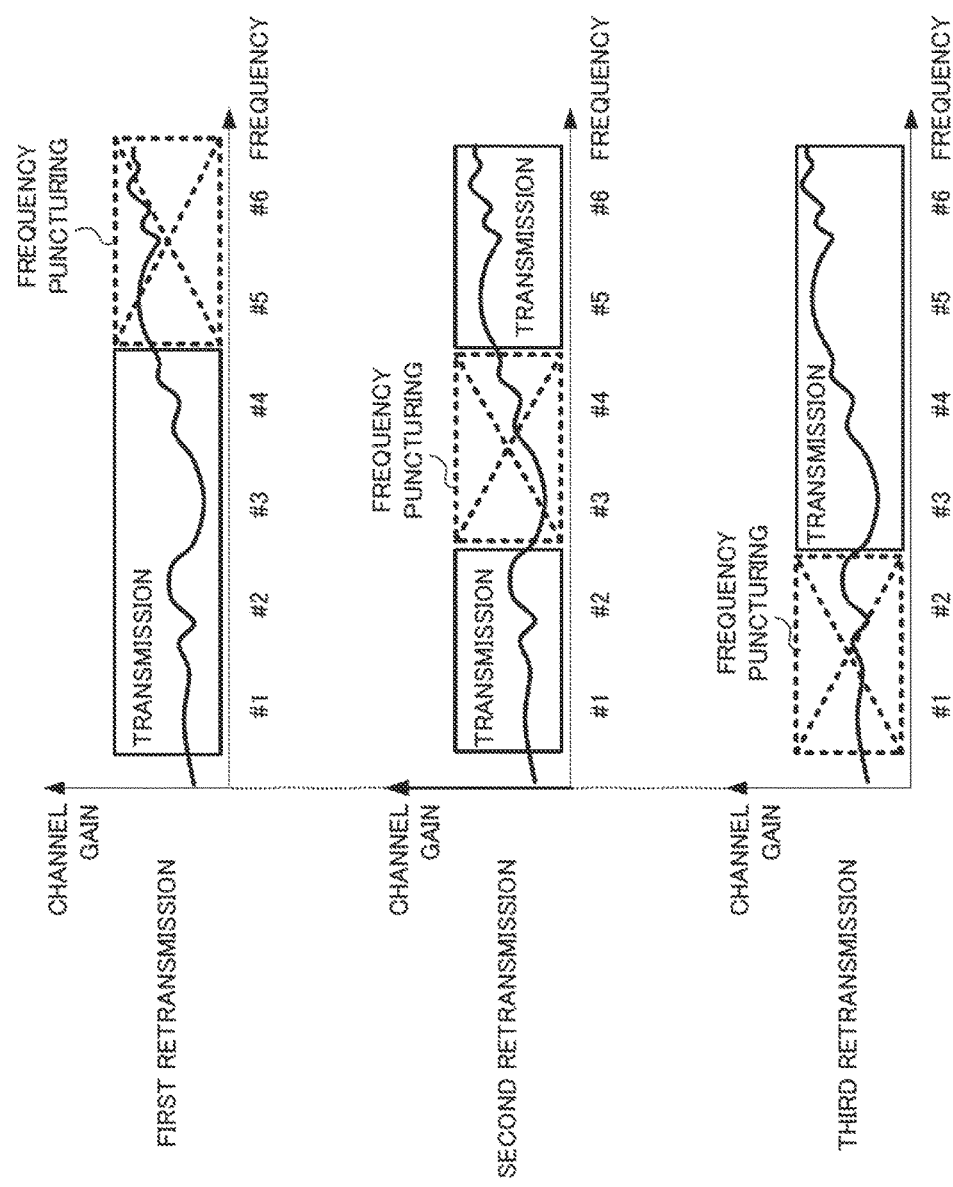
FIG. 12 illustrates the frequency puncturing when different frequency puncturing matrices are used according to Embodiment 1 of the present invention.

A description has been provided for the case where the frequency puncturing matrix expressed by expression 3 is used in the present embodiment. However, in the present embodiment, the transmission apparatus can change frequency puncturing matrices for each transmission as long as the frequency puncturing matrices provide the same frequency puncturing rate in retransmissions, for example. An example of patterns of the frequency puncturing matrix (frequency puncturing patterns) is expressed by expression 8. In expression 8, sub-carriers #1-#6 to which modulated symbols are mapped correspond to the first-sixth columns of the frequency puncturing matrices, respectively. According to expression 8, Pattern1 punctures the components of sub-carriers #5 and #6, as with expression 3, Pattern2 punctures the components of sub-carriers #3 and #4, and Pattern3 punctures the components of sub-carriers #1 and #2. For example, a case where channel gains for sub-carriers #5 and #6 are higher than channel gains for the other sub-carriers, as shown in FIG. 12, will be described. In this case, when Pattern1 is applied in the first retransmission, the high channel gains for sub-carriers #5 and #6 cannot be utilized, but by applying Pattern2 in the second retransmission and Pattern3 in the third retransmission, the high channel gains for sub-carriers #5 and #6 can be utilized in the second retransmission and the third retransmission. Thus, changing frequency puncturing matrices for each transmission may have the time diversity effect. In consequence, the error rate performances can be improved and the number of retransmissions can be reduced.

(Expression 8)

$$\text{Frequency Puncturing Patterns:} \begin{cases} \text{Pattern 1} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \end{bmatrix} \\ \text{Pattern 2} = \begin{bmatrix} 1 & 0 & 0 & 0 & 0 & 0 \\ 0 & 1 & 0 & 0 & 0 & 0 \\ 0 & 0 & 0 & 0 & 1 & 0 \\ 0 & 0 & 0 & 0 & 0 & 1 \end{bmatrix} \\ \text{Pattern 3} = \begin{bmatrix} 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix} \end{cases} \quad [8]$$

Also, when the parity bits are transmitted again after all the parity bits have been transmitted by retransmissions (when the bits stored in a CB is retransmitted in the second or later round of transmissions), the transmission apparatus may perform the frequency puncturing on the parity bits by means of a frequency puncturing matrix different from that used in the previous transmission (for example, in the first round of transmissions). For example, based on expression 8, to a certain portion of the parity bits, Pattern1 may be applied in the first round of transmissions, Pattern2 may be applied in the second round of transmissions, and Pattern3 may be applied in the third round of transmissions. This can have the time diversity effect when the same bits are retransmitted repeatedly. In consequence, the error rate performances can be improved and the number of retransmissions can be reduced.

In addition, by storing the frequency puncturing patterns expressed by expression 8 on both the transmitting side and the receiving side in advance, the need to transmit the frequency puncturing patterns in control information and the like is eliminated, and therefore an increase in the amount of control information can be prevented.

Embodiment 2

According to Embodiment 1, whether the frequency puncturing is applied or not is determined based on the number of transmissions. In contrast, according to the present embodiment, the transmission apparatus determines whether or not the frequency puncturing is applied to data to be transmitted based on a ratio of the number of systematic bits to the total number of bits of the data to be transmitted per transmission.

The present embodiment will be described in detail below.

When retransmission control section 111 of transmission apparatus 100 (FIG. 4) determines whether or not the frequency puncturing is applied to data to be transmitted in the current transmission, retransmission control section 111 uses a ratio of the number of systematic bits to the total number of bits of the data to be transmitted in the current transmission input from the retransmission information input from feedback information demodulation section 110 and the like. In particular, retransmission control section 111 calculates the ratio $R_s$ of the number of systematic bits to the total number of bits of the data to be transmitted per transmission by using the following expression 9:

(Expression 9)

$$R_s = \frac{\text{Number of Systemic Bits [bits]}}{\text{Number of Bits to Be Transmitted}} \quad [9]$$

[bits per transmission]

If $R_s$ corresponding to the data to be transmitted in the current transmission is equal to or greater than a predetermined threshold $T_1$ (threshold for determination of whether the frequency puncturing can be applied or not), i.e., the ratio of the number of systematic bits to the total number of bits of the data to be transmitted is high, then, retransmission control section 111 determines that the frequency puncturing is not performed on the data to be transmitted. Otherwise, if $R_s$ corresponding to the data to be transmitted in the current transmission is less than the threshold $T_1$, i.e., the ratio of the number of systematic bits to the number of bits of the data to be transmitted is low (the ratio of the number of parity bits to the number of bits of the data to be transmitted is high), retransmission control section 111 determines that the frequency puncturing is performed on the data to be transmitted.

As a result, frequency puncturing section 105 performs the frequency puncturing on the data to be transmitted if $R_s$ is less than the threshold $T_1$, and does not perform the frequency puncturing on the data to be transmitted if $R_s$ is equal to or greater than the threshold $T_1$.

In addition, if $R_s$ corresponding to the data to be transmitted in the current transmission is equal to or greater than the threshold $T_1$, since the frequency puncturing is not performed on the data to be transmitted, retransmission control section 111 may reduce the time puncture rate $R_t$ accordingly, for example. On the contrary, if $R_s$ corresponding to the data to be transmitted in the current transmission is less than the threshold $T_1$, since the frequency puncturing is performed on the data to be transmitted, retransmission control section 111 may increase the time puncture rate $R_t$ accordingly. Time puncturing section 102 therefore sets the time puncturing rate according to the following expression 10:

(Expression 10)

$$\begin{cases} \text{if } R_s \geq T_1 \rightarrow R_t\text{: low} \\ \text{else} \rightarrow R_t\text{: high} + \text{Frequency Puncturing} \end{cases} \quad [10]$$

Operation of transmission apparatus 100 (FIG. 4) will be described, hereinafter.

Figure 13:
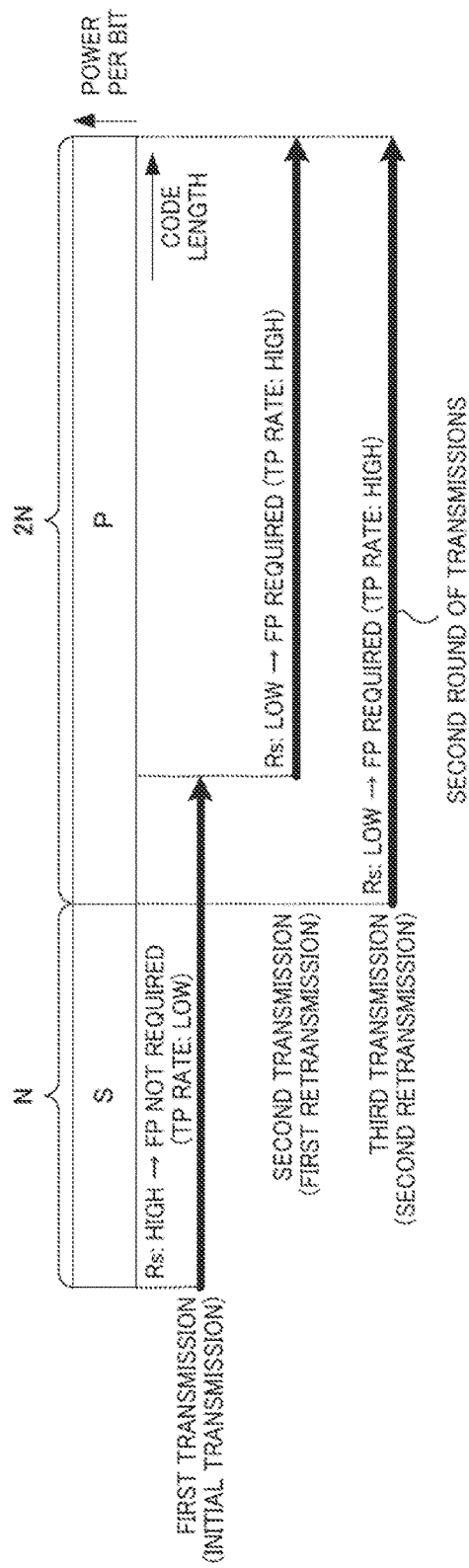
FIG. 13 illustrates an example of the transmission process according to Embodiment 2 of the present invention.

FIG. 13 illustrates an example of the transmission process in transmission apparatus 100 according to the present embodiment. As shown in FIG. 13, the number of systematic bits S is N, and the number of parity bits P is 2N.

FIG. 14 shows the number of bits to be transmitted (the number of bits that are actually transmitted), the ratio $R_s$ of the number of systematic bits to the total number of bits of the data to be transmitted (expression 9), the frequency puncturing rate $R_f$ (expression 1), the effective number of bits to be transmitted (expression 6), and the code rate R on the receiving side (expression 7) for each number of transmissions, according to the present embodiment. In addition, it is assumed that the threshold $T_1$=0.5 in FIG. 14.

As shown in FIG. 13 and FIG. 14, the number of bits to be transmitted in the first transmission (in the initial transmission) is 4N/3 [bits], and the number of systematic bits included in the data to be transmitted is N [bits]. Thus, according to expression 9, $R_s$=(N/(4N/3))=0.75. As a result, $R_s$ (=0.75) is greater than the threshold $T_1$ (=0.5) in the first transmission (in the initial transmission). Retransmission control section 111, therefore, does not apply the frequency puncturing on the data to be transmitted ($R_f$=1) and reduces the TP rate ($R_t$). As shown in FIG. 14, if the frequency puncturing is not applied, the effective number of bits to be transmitted is equal to the number of bits to be transmitted. Moreover, the code rate R=¾ at reception apparatus 200 (FIG. 5).

As shown in FIG. 13 and FIG. 14, the number of bits to be transmitted in the second transmission (in the first retransmission) is 5N/3 [bits], and the number of systematic bits included in the data to be transmitted is 0 [bits]. Thus, according to expression 9, $R_s$=(0/(5N/3))=0. Consequently, $R_s$ (=0) is less than the threshold $T_1$ (=0.5) in the second transmission (in the first retransmission). Retransmission control section 111, therefore, applies the frequency puncturing on the data to be transmitted ($R_f$=⅘, according to FIG. 14) and increases the TP rate ($R_t$). As shown in FIG. 14, since the frequency puncturing ($R_f$=⅘) is applied, the effective number of bits to be transmitted is 4N/3, which is less than the number of bits to be transmitted (5N/3) as a result of thinning. Reception apparatus 200 receives 4N/3 [bits] in the first transmission and 5N/3 [bits] in the second transmission, i.e., 3N [bits] in total. Thus, since the number of systematic bits among the total 3N [bits] is N [bits], the code rate R=⅓ at reception apparatus 200.

The third transmission (the second retransmission) can be conducted in a similar way.

As described above, according to the present embodiment, transmission apparatus 100 determines whether or not the frequency puncturing is applied based on a ratio of the number of systematic bits to the total number of bits of the data to be transmitted per transmission (or a ratio between the systematic bits and the parity bits). When the systematic bits prevail in the data to be transmitted ($R_s \leq T_1$), transmission apparatus 100 places priority on preventing deterioration of the error rate performances for the systematic bits, and thus does not apply the frequency puncturing. On the contrary, when the parity bits prevail in the data to be transmitted ($R_s < T_1$), transmission apparatus 100 places priority on improving the error correction coding gain for the parity bits, and thus applies the frequency puncturing. In consequence, the error rate performances at reception apparatus 200 can be improved even when the data to be transmitted in each transmission includes both the systematic bits and the parity bits.

According to the present embodiment, whether the frequency puncturing is applied or not is therefore controlled based on the content of data to be transmitted in each transmission. According to the present embodiment, this enables a reduction in the number of packet reception errors and the number of retransmissions by improving the error correction coding gain without an increase in the amount of resources used for transmission as in Embodiment 1.

Embodiment 3

According to the present embodiment, the transmission apparatus determines whether or not the frequency puncturing is applied to data to be transmitted based on the code rate at the reception apparatus.

The present embodiment will be described in detail below.

When retransmission control section 111 of transmission apparatus 100 (FIG. 4) determines whether or not the frequency puncturing is applied to data to be transmitted in the current transmission, retransmission control section 111 determines the frequency puncturing rate $R_f$ based on the code rate R at reception apparatus 200 (FIG. 5) (expression 7, i.e., a ratio of the number of systematic bits to the total number of bits of transmitted data received by reception apparatus 200). As a result, frequency puncturing section 105 performs the frequency puncturing with the frequency puncturing rate $R_f$ changed based on the code rate R at reception apparatus 200.

Operation of transmission apparatus 100 (FIG. 4) will now be described.

Figure 15:
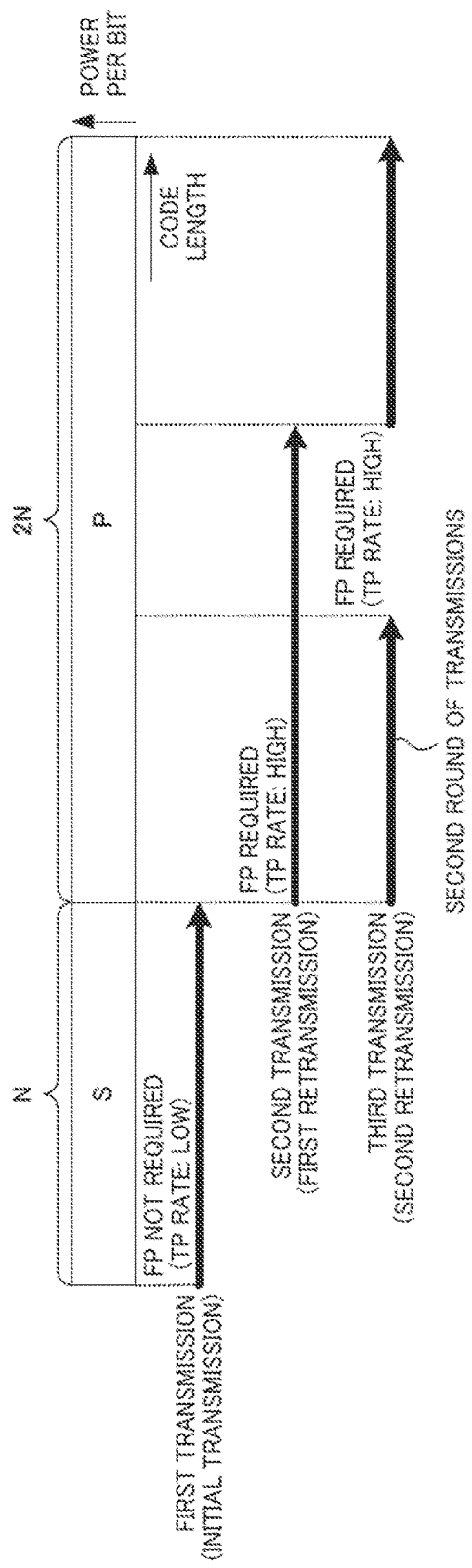
FIG. 15 illustrates an example of the transmission process according to Embodiment 3 of the present invention.

FIG. 15 illustrates an example of the transmission process in transmission apparatus 100 according to the present embodiment. As shown in FIG. 15, the number of systematic bits S is N, and the number of parity bits P is 2N.

Figures 16, 17:
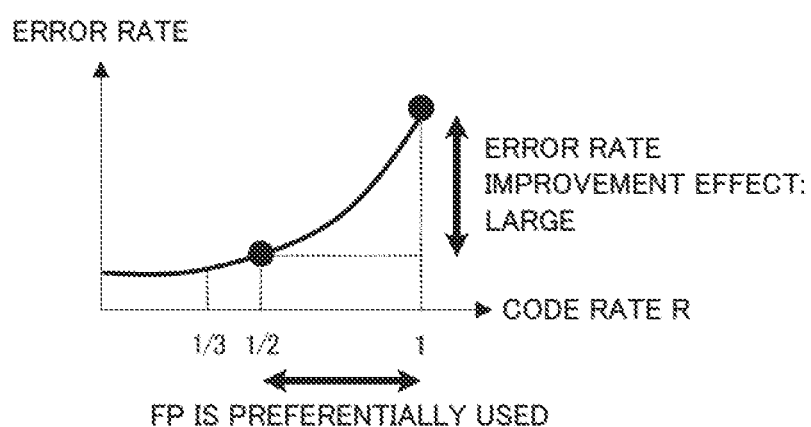
FIG. 16 shows a relationship between the code rate at the reception apparatus and the frequency puncturing rate according to Embodiment 3 of the present invention.
FIG. 17 illustrates a relationship between the code rate and the error rate performances according to Embodiment 3 of the present invention.

Moreover, FIG. 16 shows a code rate R on the receiving side (expression 7) and a frequency puncturing rate $R_f$ (expression 1) for each number of transmissions according to the present embodiment.

As shown in FIG. 15 and FIG. 16, only N [bits] systematic bits S are transmitted in the first transmission (in the initial transmission). Thus, according to expression 7, R=(N/N)=1. In this case, retransmission control section 111 does not apply the frequency puncturing on initial-transmission data including only the systematic bits as in embodiment 1. That is, the frequency puncturing rate $R_f$=1 in the first transmission (in the initial transmission). Consequently, when the code rate R=1 at reception apparatus 200, frequency puncturing section 105 does not perform the frequency puncturing on the data to be transmitted (the systematic bits S).

As shown in FIG. 15 and FIG. 16, when the code rate R at reception apparatus 200 is in the range of ½<R<1 in the second transmission (in the first retransmission), frequency puncturing section 105 performs the frequency puncturing on retransmission data. Similarly, as shown in FIG. 15 and FIG. 16, when the code rate R at reception apparatus 200 is in the range of ⅓<R≤½ in the third transmission (in the second retransmission), frequency puncturing section 105 performs the frequency puncturing on retransmission data.

However, as shown in FIG. 16, the frequency puncturing rate $R_f$=⅔ in the second transmission (in the first retransmission), and the frequency puncturing rate $R_f=4/5$ in the third transmission (in the second retransmission). The frequency puncturing rate $R_f$ is therefore lower (more frequency components are punctured) in the case where the code rate R at reception apparatus 200 is in the range of $1/2 < R < 1$ than in the case where the code rate R at reception apparatus 200 is in the range of $1/3 < R \leq 1/2$.

FIG. 17 illustrates the relationship between the code rate R and the error rate at reception apparatus 200. As shown in FIG. 17, the lower the code rate R is (i.e., the larger the number of parity bits is), the lower the error rate becomes. More specifically, as shown in FIG. 17, the degree of a decrease in the error rate (i.e., an improvement effect on the error rate) with a decrease in the code rate R (an increase in the number of parity bits) is larger in a higher range of the code rate R (for example, the range of $1/2 < R < 1$) than in a lower range of the code rate R (for example, the range of $1/3 < R \leq 1/2$). An increase in the number of parity bits therefore has a larger improvement effect on the error rate in a higher range of the code rate R than in a lower range of the code rate R.

As described above, the frequency puncturing can virtually increase the number of bits of data to be transmitted to lower the code rate, thereby improving error correction performance.

Thus, as shown in FIG. 16, transmission apparatus 100 can set the frequency puncturing rate $R_f$ lower in a higher range of the code rate R (for example, the range of $1/2 < R < 1$) than in a lower range of the code rate R (for example, the range of $1/3 < R \leq 1/2$) to improve the error rate efficiently. In particular, transmission apparatus 100 can set the frequency puncturing rate $R_f$ lower in a higher range of the code rate R at reception apparatus 200 to put priority on the improvement of the error rate by the frequency puncturing. On the contrary, transmission apparatus 100 can set the frequency puncturing rate $R_f$ higher in a lower range of the code rate R at reception apparatus 200 to put priority on the prevention of inter-symbol interference due to deterioration of the "unitarity between the transmitting DFT and the receiving IDFT" by the frequency puncturing.

As described above, the frequency puncturing rate is controlled based on the code rate R at reception apparatus 200 according to the present embodiment. It is thus possible to reduce the number of packet reception errors by improving the error correction coding gain without an increase of the amount of resources used for transmission and thus to reduce the number of retransmissions as in Embodiment 1, according to the present embodiment.

Embodiment 4

A description will be provided for the case where encoded data (systematic bits and parity bits) generated in the transmission apparatus is retransmitted after all of the encoded data has been transmitted in the present embodiment. In other words, a description will be provided for the case where bits to be transmitted stored in a CB of the transmission apparatus are transmitted again (in the second round of transmissions) after all the bits to be transmitted in the CB have been transmitted (after the first round of transmissions).

The present embodiment will be described in detail below.

When encoded data is retransmitted (in the second round of transmissions) after all the bits constituting the encoded data have been transmitted, retransmission control section 111 of transmission apparatus 100 (FIG. 4) instructs time puncturing section 102 to extract bits in sequence so that bits on which the frequency puncturing is performed in the first round of transmissions (particular bits) are extracted first.

As a result, when encoded data is retransmitted (in the second round of transmissions) after all the bits constituting the encoded data have been transmitted, time puncturing section 102 extracts bits of the encoded data stored in a CB in sequence so that bits on which the frequency puncturing is performed are extracted first, thereby generating retransmission data.

Operation of transmission apparatus 100 (FIG. 4) will be described, hereinafter.

Figure 18:
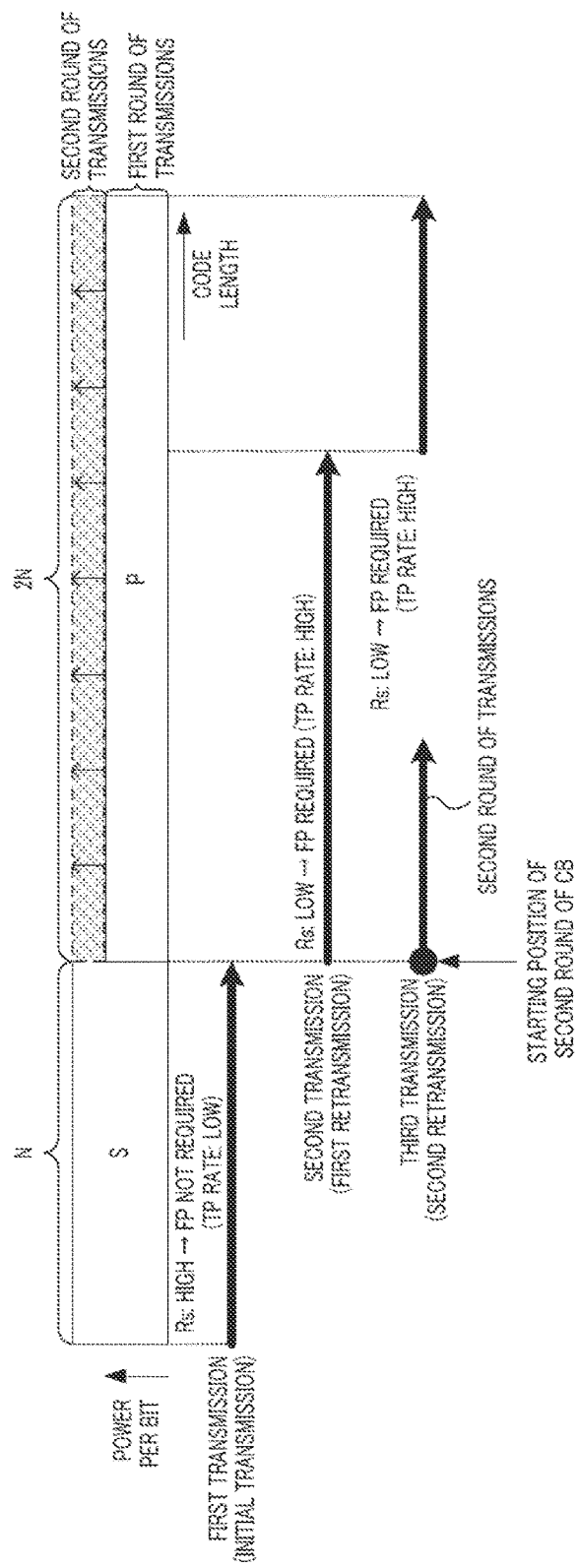
FIG. 18 illustrates an example of the transmission process according to Embodiment 4 of the present invention (retransmission example 1)
Figure 19:
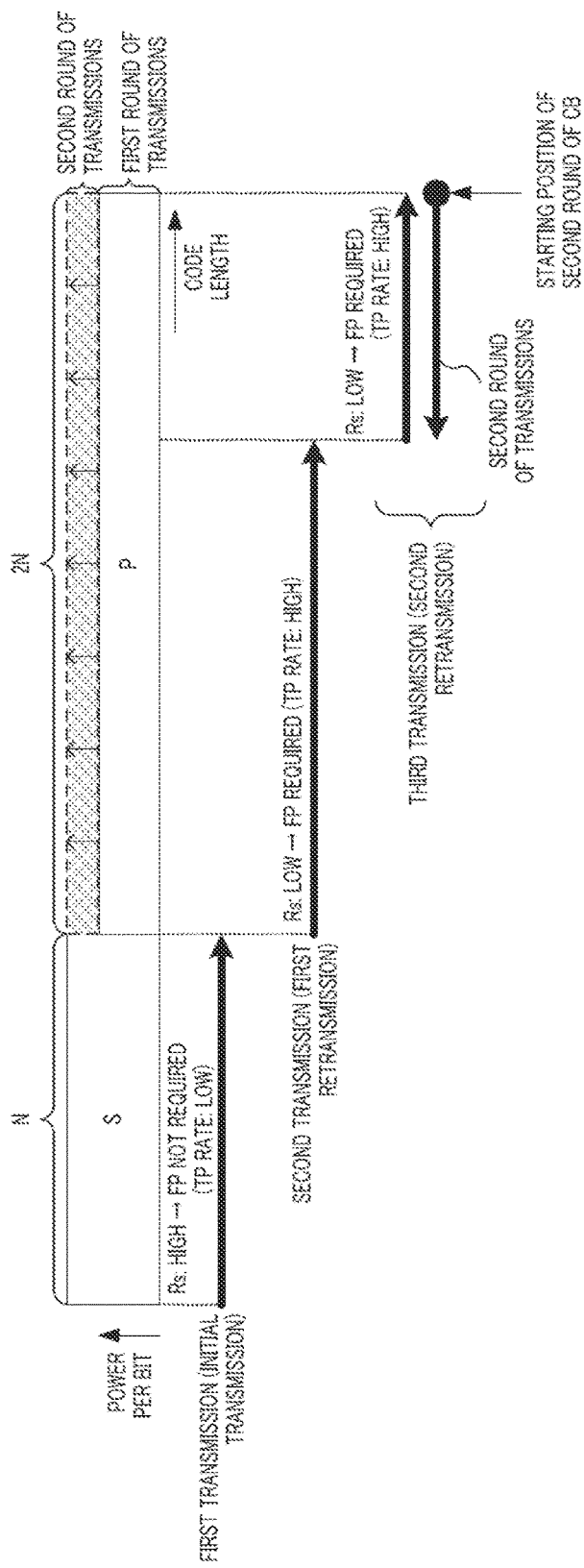
FIG. 19 illustrates an example of the transmission process according to Embodiment 4 of the present invention (retransmission example 2)

Retransmission examples 1 and 2 will be described below. In the following description, as shown in FIG. 18 and FIG. 19, systematic bits S are transmitted in the first transmission (in the initial transmission), and parity bits P are transmitted in the second and third transmissions (in the first and second retransmissions). As shown in FIG. 18 and FIG. 19, the first round of transmissions of all the bits constituting the encoded data (S and P) completes and the second round of transmissions of the encoded data starts halfway in the third transmission (in the second retransmission). As shown in FIG. 18 and FIG. 19, the frequency puncturing is not performed on the systematic bits S and is performed on the parity bits P in the first to third transmissions.

Retransmission Example 1

FIG. 18

In retransmission example 1, when the encoded data is retransmitted after all the bits constituting the encoded data have been transmitted, time puncturing section 102 extracts the particular bits on which the frequency puncturing is performed before transmission in the first round of transmissions, in chronological order of transmission, thereby generating retransmission data.

For example, as shown in FIG. 18, the frequency puncturing is performed only on the parity bits P in the encoded data transmitted in the first round of transmissions.

Time puncturing section 102 therefore extracts the parity bits on which the frequency puncturing is performed before transmission in the first round of transmissions, in chronological order of bit positions of transmission (from the starting position of second round of the CB shown in FIG. 18), thereby generating retransmission data. That is, as shown in FIG. 18, upon completion of the first round of transmissions of all the encoded data in the third transmission (in the second retransmission), time puncturing section 102 extracts the parity bits in sequence from the top of the parity bits as retransmission data for the second round of transmissions.

Furthermore, in order to identify the starting position of the second round of transmissions, retransmission control section 111 may number the bits constituting the encoded data in ascending order from the top of the bits and store the smallest number among the numbers of the bits to which the frequency puncturing is applied in the first round of transmissions, for example. Then, retransmission control section 111 may indicate to time puncturing section 102 a bit having the stored number as the starting position in the second round of transmissions.

Retransmission Example 2

FIG. 19

In retransmission example 2, when the encoded data is retransmitted after all the bits constituting the encoded data have been transmitted, time puncturing section 102 extracts the particular bits on which the frequency puncturing is performed before transmission in the first round of transmissions, in reverse chronological order of transmission, thereby generating retransmission data.

For example, as shown in FIG. 19, the frequency puncturing is performed only on the parity bits P in the encoded data transmitted in the first round of transmissions.

Time puncturing section 102 therefore extracts the parity bits on which the frequency puncturing was performed before transmission in the first round of transmissions, in reverse chronological order of bit positions of transmission (from the starting position of second round of the CB shown in FIG. 19), thereby generating retransmission data. That is, as shown in FIG. 19, upon completion of the first round of transmissions of all the encoded data in the third transmission (in the second retransmission), time puncturing section 102 extracts the parity bits in sequence from the end of the parity bits as retransmission data for the second round of transmissions.

Furthermore, in order to identify the starting position of the second round of transmissions, retransmission control section 111 may indicate to time puncturing section 102 the last bit of the encoded bits stored in the CB as the starting position in the second round of transmissions, for example.

Retransmission examples 1 and 2 have been described above.

In addition, when the encoded data is retransmitted after all the bits constituting the encoded data have been transmitted, upon completion of transmission of all the above-described particular bits (the bits on which the frequency puncturing is performed before the previous transmission), time puncturing section 102 may extract bits on which the frequency puncturing is not performed before the transmission in the first round of transmissions from the encoded data in sequence to generate retransmission data (not shown).

As described above, when the encoded data is retransmitted after all of the encoded data stored in the CB has been transmitted, time puncturing section 102 extracts data to be transmitted in sequence not from bits located at the top of the CB (systematic bits) again but from bits to which the frequency puncturing was applied (parity bits, according to FIGS. 18 and 19).

In the first round of transmissions, the reception quality of bits that are frequency-punctured (parity bits, according to FIGS. 18 and 19) deteriorates as compared to the reception quality of bits that are not frequency-punctured (systematic bits, according to FIGS. 18 and 19) because of inter-symbol interference due to deterioration of unitarity caused by the frequency puncturing. However, as shown in FIG. 18 and FIG. 19, transmission apparatus 100 can transmits bits that are frequency-punctured (parity bits, according to FIGS. 18 and 19) first in the second round of transmissions to complement the bits that are frequency-punctured (i.e., the bits the transmission power of which was reduced) in the first round of transmissions. Thus, in reception apparatus 200 (FIG. 5), the reception quality of bits that are frequency-punctured (parity bits, according to FIGS. 18 and 19) in the first round of transmissions can be complemented in a small number of transmissions (at the beginning of retransmission in the second round of transmissions), and chances of reducing the number of retransmissions can be increased.

FIG. 18 and FIG. 19 illustrate the case where in the second round of transmissions, transmission apparatus 100 extracts bits in sequence so that bits that are frequency-punctured before transmission in the first round of transmissions are extracted first, thereby generating data to be transmitted. However, according to the present embodiment, transmission apparatus 100 may extract bits from the encoded data in sequence so that parity bits are extracted first in the second round of transmissions to generate data to be transmitted. That is, transmission apparatus 100 may simply extract parity bits as data to be transmitted in the second round of transmissions regardless of whether the frequency puncturing is applied or not in the first round of transmissions. In addition, when the encoded data is retransmitted after all the bits constituting the encoded data have been transmitted, upon completion of transmission of all the parity bits, transmission apparatus 100 may extract systematic bits from the encoded data in sequence to generate retransmission data.

Figure 20:
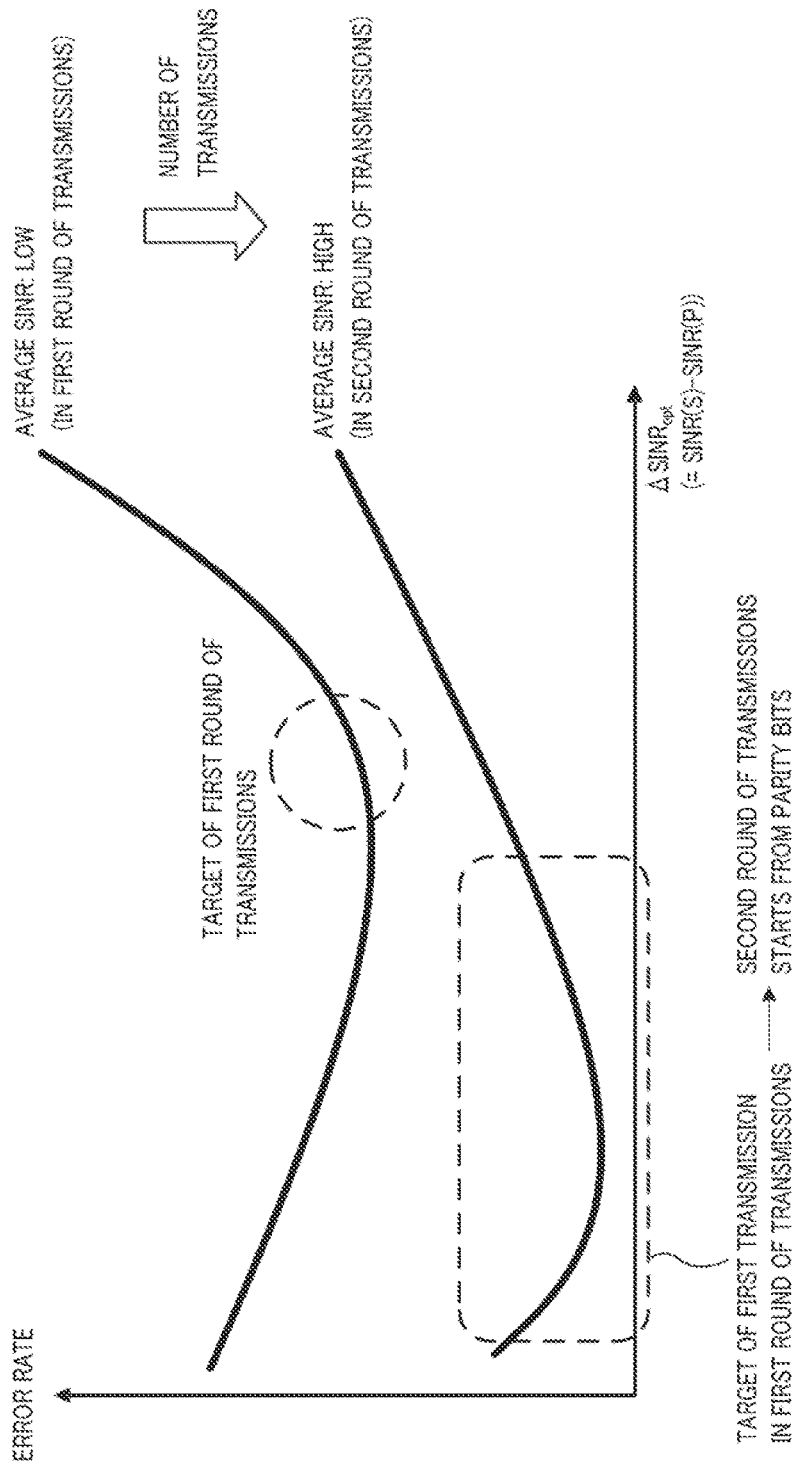
FIG. 20 illustrates a relationship between the error rate performances and a difference in SINR between systematic bits and parity bits according to Embodiment 4 of the present invention.

For example, for an encoded data sequence generated by turbo coding, a difference between the SINR (Signal to Interference and Noise Ratio) of systematic bits and the SINR of parity bits for achieving the optimal error rate (hereinafter referred to as $\Delta SINR_{opt}$) varies depending on the average SINR. In particular, as shown in FIG. 20, the $\Delta SINR_{opt}$ is large when the average SINR is small (for example, in the first round of transmissions). On the contrary, the $\Delta SINR_{opt}$ is small when the average SINR is large (for example, in the second round of transmissions). Transmission apparatus 100 can therefore improve the error rate by transmitting the parity bits first to reduce the $\Delta SINR_{opt}$ in the second round of transmissions.

In this way, according to the present embodiment, bits are retransmitted in sequence so that bits on which the frequency puncturing was performed in the first round of transmissions (or simply parity bits) are transmitted first in the second round of transmissions from the CB. Thus, according to the present embodiment, it is made possible to reduce the number of packet reception errors by improving the error correction coding gain without an increase of the amount of resources used for transmission and thus to reduce the number of retransmissions.

In addition, upon completion of retransmission of all the bits on which the frequency puncturing is performed in the first round of transmissions (or simply parity bits), the transmission apparatus retransmits bits on which the frequency puncturing is not performed in the first round of transmissions (or simply systematic bits) in the second round of transmissions from the CB. This enables further improvement of the reception quality of systematic bits in reception apparatus 200, resulting in reduction of the number of packet reception errors and the number of retransmissions.

A description has been provided for the case where the transmission apparatus performs the frequency puncturing again on bits transmitted in the second round of transmissions according to the present embodiment. However, the transmission apparatus may not perform the frequency puncturing on the bits transmitted in the second round of transmissions. By doing so, the reception quality of bits that were frequency-punctured in the first round of transmissions can be complemented efficiently in the second round of transmissions.

The embodiments of the present invention have been described above.

Figure 21:
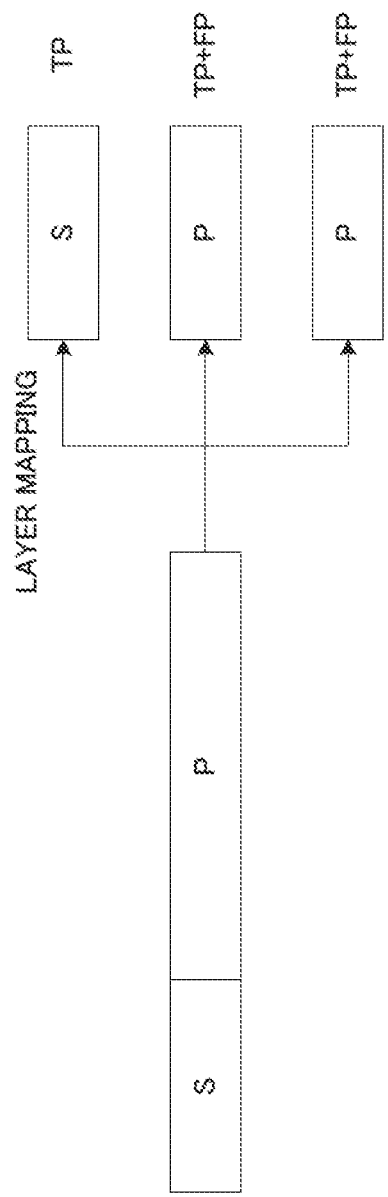
FIG. 21 illustrates a variation of the present invention.

A description has been provided for the case where, in HARQ based on IR using a CB, systematic bits and parity bits are separated in the time domain, and whether or not the frequency puncturing can be applied is determined for each data to be transmitted at each time instance in the above-described embodiments. However, the present invention is not limited to the case of the time domain and can be used in the case where systematic bits and parity bits are separated in a domain other than the time domain. For example, with the use of multi-carrier signal transmission, the transmission apparatus may separate systematic bits and parity bits in the frequency domain and determine whether or not the frequency puncturing can be applied for each sub-carrier. Alternatively, the present invention may be applied to SU-MIMO (Single User-Multiple Input Multiple Output) in which one code word is mapped to multiple layers as shown in FIG. 21. In particular, systematic bits and parity bits may be separated in the spatial domain by mapping the systematic bits and the parity bits to multiple layers as shown in FIG. 21, and then, whether or not the frequency puncturing can be applied may be determined for each layer.

In the embodiment described above, the present invention is configured with hardware by way of example, but the invention may also be provided by software in concert with hardware.

In addition, the functional blocks used in the descriptions of the embodiments are typically implemented as LSI devices, which are integrated circuits. The functional blocks may be formed as individual chips, or a part or all of the functional blocks may be integrated into a single chip. The term "LSI" is used herein, but the terms "IC," "system LSI," "super LSI" or "ultra LSI" may be used as well depending on the level of integration.

In addition, the circuit integration is not limited to LSI and may be achieved by dedicated circuitry or a general-purpose processor other than an LSI. After fabrication of LSI, a field programmable gate array (FPGA), which is programmable, or a reconfigurable processor which allows reconfiguration of connections and settings of circuit cells in LSI may be used.

Should a circuit integration technology replacing LSI appear as a result of advancements in semiconductor technology or other technologies derived from the technology, the functional blocks could be integrated using such a technology. Another possibility is the application of biotechnology and/or the like.

The disclosure of the specification, drawings, and abstract included in Japanese Patent Application No. 2011-186909, filed on Aug. 30, 2011 is incorporated herein by reference in its entirety.

INDUSTRIAL APPLICABILITY

The present invention is suitable for use in mobile communication systems, for example.

REFERENCE SIGNS LIST

100 Transmission apparatus
101 Coding section
102 Time puncturing section
103 Modulation section
104, 204 DFT section
105 Frequency puncturing section
106, 207 IDFT section
107 CP adding section
108 DAC section
109, 201 Antenna
110 Feedback information demodulation section
111 Retransmission control section
200 Reception apparatus
202 ADC section
203 CP removing section
205 Channel estimation section
206 Frequency equalization section
208 Demodulation section
209 Decoding section
210 Feedback information generation section

The invention claimed is:

1. A transmission apparatus that transmits, in sequence on a per transmission basis, bits of encoded data including a systematic bit and a parity bit, and that performs time puncturing and frequency puncturing, the time puncturing being performed on the bits of encoded data on a per bit basis in a time domain, the frequency puncturing being performed, on a per symbol basis, on the encoded data in which the bits are convoluted into a plurality of symbols in a frequency domain, the transmission apparatus comprising:
   a time puncturing section that performs the time puncturing on the encoded data by extracting data from the encoded data on a per transmission basis; and
   a frequency puncturing section that performs the frequency puncturing on the data after the time puncturing based on a ratio between a systematic bit and a parity bit included in the data, wherein
   the frequency puncturing section does not perform the frequency puncturing on the data, when a ratio of a number of systematic bits to a total number of bits of the data is equal to or greater than a predetermined threshold, and performs the frequency puncturing on the data when the ratio of the number of systematic bits to the total number of bits of the data is less than the predetermined threshold.

2. The transmission apparatus according to claim 1, wherein the frequency puncturing section performs the frequency puncturing on the data including only a parity bit and does not perform the frequency puncturing on the data including only a systematic bit.

3. The transmission apparatus according to claim 1, wherein:
   the transmission apparatus transmits the data including only a systematic bit in an initial transmission and transmits the data including only a parity bit in a retransmission; and
   the frequency puncturing section does not perform the frequency puncturing in the initial transmission but performs the frequency puncturing in the retransmission.

4. The transmission apparatus according to claim 3, wherein:
   a puncturing rate of the frequency puncturing is expressed as a ratio of a number of symbols after the frequency puncturing to a number of symbols before the frequency puncturing; and
   the frequency puncturing section changes the frequency puncturing rate for the data based on a number of transmissions.

5. The transmission apparatus according to claim 1, wherein:
   a puncturing rate of the frequency puncturing is expressed as a ratio of a number of symbols after the frequency puncturing to a number of symbols before the frequency puncturing; and
   the frequency puncturing section changes the puncturing rate for the data based on a code rate that is expressed as a ratio of a number of systematic bits to a total number of bits of the data received in a reception apparatus.

6. The transmission apparatus according to claim 1, wherein:

the frequency puncturing section performs the frequency puncturing by multiplying the data by a puncturing matrix that includes a puncturing rate and a position of a symbol to be punctured by the frequency puncturing, the puncturing rate being expressed as a ratio of a number of symbols after the frequency puncturing to a number of symbols before the frequency puncturing; and the puncturing matrix is changed for each transmission.

7. The transmission apparatus according to claim 1, wherein, when the encoded data is retransmitted after all bits included in the encoded data are transmitted, the time puncturing section extracts a particular bit on which the frequency puncturing is performed before transmission from the encoded data and generates the data.

8. The transmission apparatus according to claim 7, wherein, when the encoded data is retransmitted after all bits included in the encoded data are transmitted, the time puncturing section extracts the particular bits in chronological order of transmission of the particular bits and generates the data.

9. The transmission apparatus according to claim 7, wherein, when the encoded data is retransmitted after all bits included in the encoded data are transmitted, the time puncturing section extracts the particular bits in reverse chronological order of transmission of the particular bits and generates the data.

10. The transmission apparatus according to claim 7, wherein, when the encoded data is retransmitted after all bits included in the encoded data are transmitted, the time puncturing section extracts a bit on which the frequency puncturing is not performed from the encoded data and generates the data after all the particular bits are retransmitted.

11. The transmission apparatus according to claim 1, wherein, when the encoded data is retransmitted after all bits included in the encoded data are transmitted, the time puncturing section extracts a parity bit from the encoded data and generates the data.

12. The transmission apparatus according to claim 11, wherein, when the encoded data is retransmitted after all bits included in the encoded data are transmitted, the time puncturing section extracts parity bits in chronological order of the last transmission and generates the data.

13. The transmission apparatus according to claim 11, wherein, when the encoded data is retransmitted after all bits included in the encoded data are transmitted, the time puncturing section extracts parity bits in reverse chronological order of the last transmission and generates the data.

14. The transmission apparatus according to claim 11, wherein, when the encoded data is retransmitted after all bits included in the encoded data are transmitted, the time puncturing section extracts a systematic bit from the encoded data and generates the data after all parity bits are retransmitted.

15. A transmission method of transmitting, in sequence on a per transmission basis, bits of encoded data including a systematic bit and a parity bit, and performing time puncturing and frequency puncturing, the time puncturing being performed on the bits of encoded data on a per bit basis in a time domain, the frequency puncturing being performed on a per symbol basis, on the encoded data in which the bits are convoluted into a plurality of symbols in a frequency domain, the transmission method comprising:

performing the time puncturing on the encoded data by extracting data from the encoded data on a per transmission basis; and performing the frequency puncturing on the data after the time puncturing based on a ratio between a systematic bit and a parity bit included in the data, wherein the frequency puncturing is not performed on the data when a ratio of a number of systematic bits to a total number of bits of the data is equal to or greater than a predetermined threshold, and the frequency puncturing is performed on the data when the ratio of the number of systematic bits to the total number of bits of the data is less than the predetermined threshold.

* * * * *